United States Patent
Ohya et al.

(10) Patent No.: US 11,063,076 B2
(45) Date of Patent: Jul. 13, 2021

(54) IMAGING APPARATUS, IMAGING SYSTEM, AND MOBILE OBJECT HAVING PIXELS WITH DIFFERENT SATURATION CHARGE QUANTITIES

(71) Applicant: CANON KABUSHIKI KAISHA, Tokyo (JP)

(72) Inventors: Takeru Ohya, Machida (JP); Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/394,765

(22) Filed: Apr. 25, 2019

(65) Prior Publication Data

US 2019/0333949 A1    Oct. 31, 2019

(30) Foreign Application Priority Data

Apr. 26, 2018 (JP) .............................. JP2018-085872

(51) Int. Cl.
*H01L 27/146* (2006.01)
*H04N 5/232* (2006.01)
*H04N 5/235* (2006.01)

(52) U.S. Cl.
CPC .. *H01L 27/14621* (2013.01); *H01L 27/14605* (2013.01); *H04N 5/2353* (2013.01); *H04N 5/23229* (2013.01)

(58) Field of Classification Search
CPC ............. H04N 5/23229; H04N 5/2353; H04N 5/35563; H04N 5/37452; H04N 9/735; H04N 9/04555; H04N 9/04557; H04N 9/04553; H04N 5/332; H04N 5/3559; H04N 5/3532; H04N 5/378; H04N 5/369; H04N 5/374; H04N 5/341; H01L 27/14621; H01L 27/14605; H01L 27/14612; H01L 27/14656; H01L 27/14601; H01L 27/14643; H01L 27/146
See application file for complete search history.

(56) References Cited

U.S. PATENT DOCUMENTS

| 6,246,436 | B1 | 6/2001 | Lin |
| 2011/0063483 | A1 | 3/2011 | Rossi |
| 2011/0096216 | A1 | 4/2011 | Kawai |

(Continued)

FOREIGN PATENT DOCUMENTS

| JP | S62-073891 A | 4/1987 |
| JP | H10-143245 A | 5/1998 |

(Continued)

*Primary Examiner* — Nelson Garces
(74) *Attorney, Agent, or Firm* — Canon U.S.A., Inc. IP Division

(57) ABSTRACT

An imaging apparatus performs a global electronic shutter operation. During an exposure period for acquiring one frame, the imaging apparatus transfers electric charges accumulated in a first period from a photoelectric conversion portion to a holding portion. When a second period has elapsed since an end time of the first period, the holding portion holds both electric charges generated in the first period and electric charges generated in the second period. A plurality of pixels included in the imaging apparatus includes a first pixel and a second pixel each having a different saturation charge quantity of the photoelectric conversion portion included in each pixel.

22 Claims, 23 Drawing Sheets

(56) References Cited

U.S. PATENT DOCUMENTS

| | | | |
|---|---|---|---|
| 2011/0140182 A1* | 6/2011 | Tanaka | H01L 27/14621 |
| | | | 257/292 |
| 2013/0214371 A1 | 8/2013 | Asatsuma | |
| 2015/0054997 A1 | 2/2015 | Hynecek | |
| 2015/0264244 A1 | 9/2015 | Ichikawa | |
| 2017/0034466 A1 | 2/2017 | Numata | |
| 2017/0078557 A1 | 3/2017 | Kawabata | |
| 2017/0078605 A1* | 3/2017 | Kobayashi | H04N 5/36961 |
| 2017/0104939 A1 | 4/2017 | Sun | |
| 2017/0221947 A1 | 8/2017 | Shishido | |
| 2017/0264848 A1 | 9/2017 | Kurokawa | |
| 2017/0352697 A1 | 12/2017 | Onuki | |
| 2018/0184036 A1* | 6/2018 | Sato | G02B 7/34 |

FOREIGN PATENT DOCUMENTS

| | | |
|---|---|---|
| JP | 2009-296400 A | 12/2009 |
| JP | 2010-041261 A | 2/2010 |
| JP | 2010-093644 A | 4/2010 |
| JP | 2015-177349 A | 10/2015 |
| JP | 2015-220532 A | 12/2015 |
| JP | 2018-045482 A | 3/2018 |
| RU | 72779 U1 | 4/2008 |
| RU | 2015-107545 A | 9/2016 |
| WO | 99/65248 A | 12/1999 |
| WO | 2010/116974 A1 | 10/2010 |
| WO | 2016/204507 A1 | 12/2016 |
| WO | 2017/006781 A1 | 1/2017 |
| WO | 2017/169754 A1 | 10/2017 |

* cited by examiner

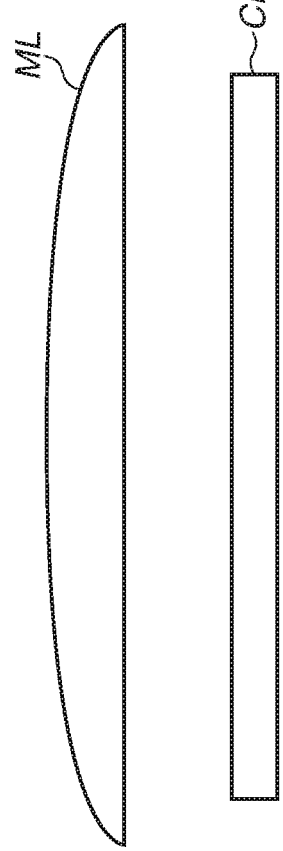
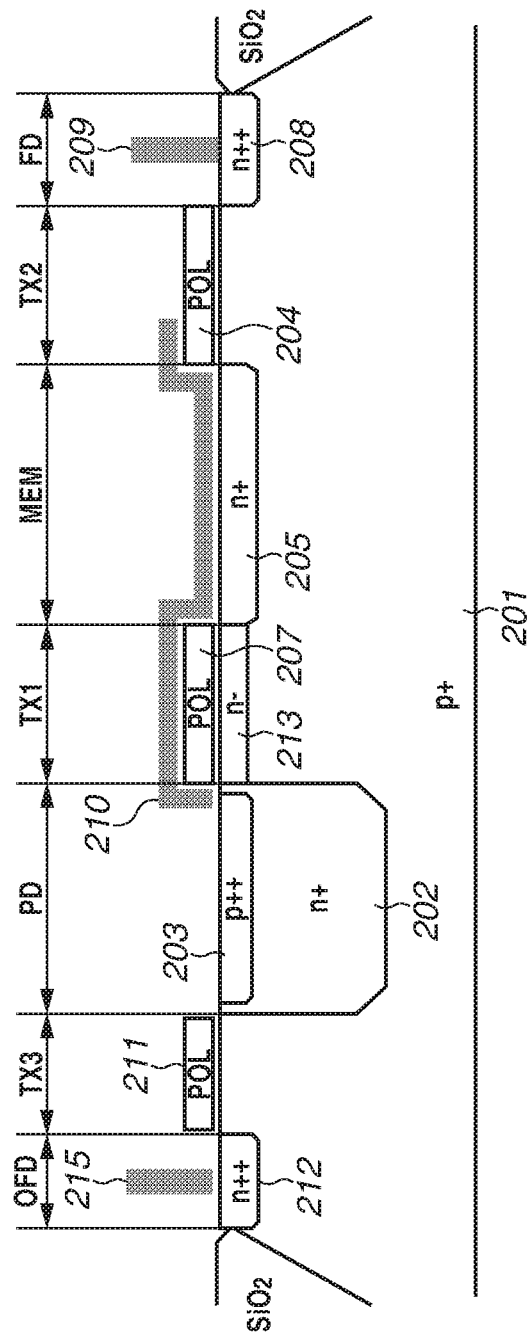

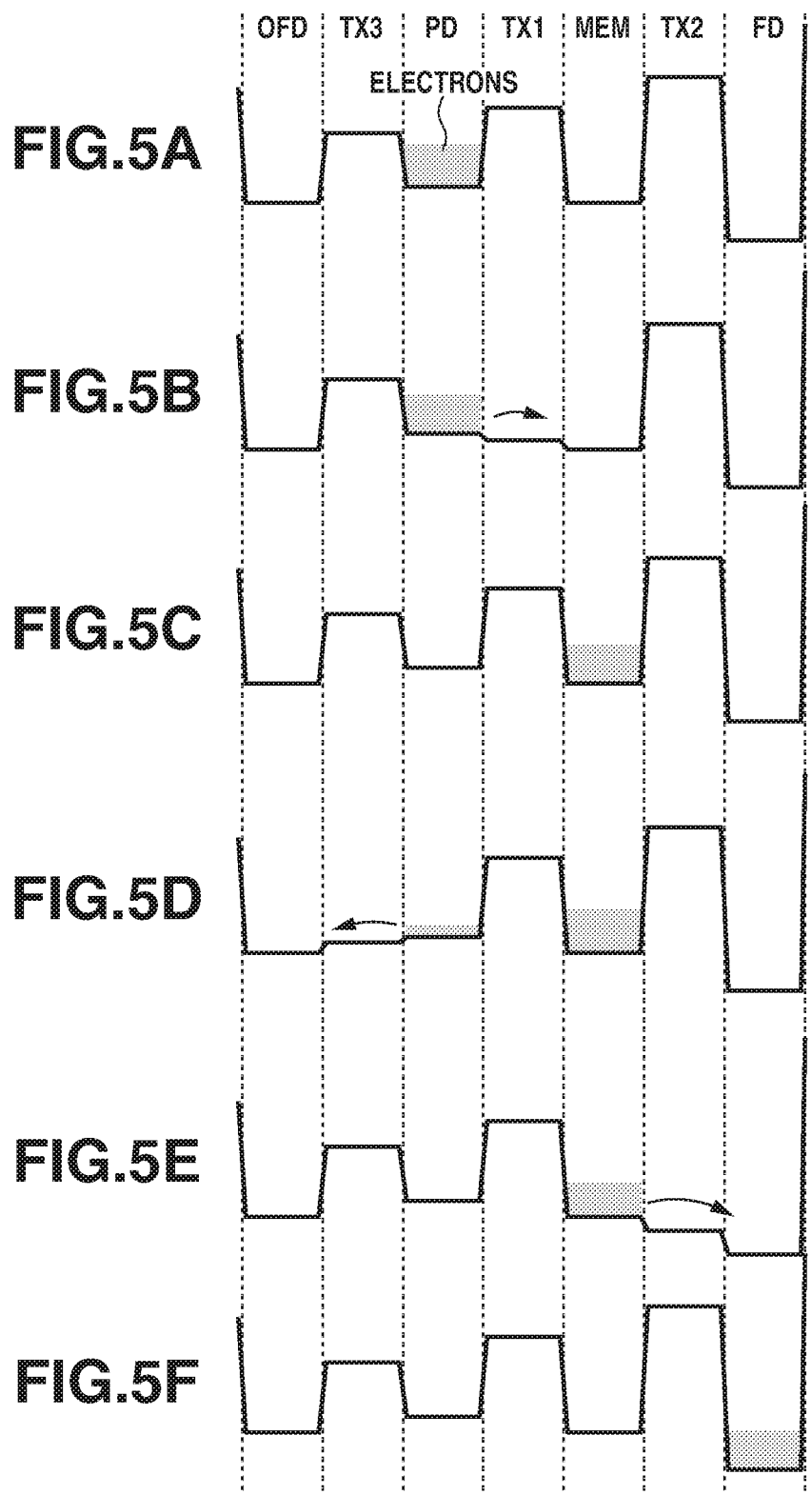

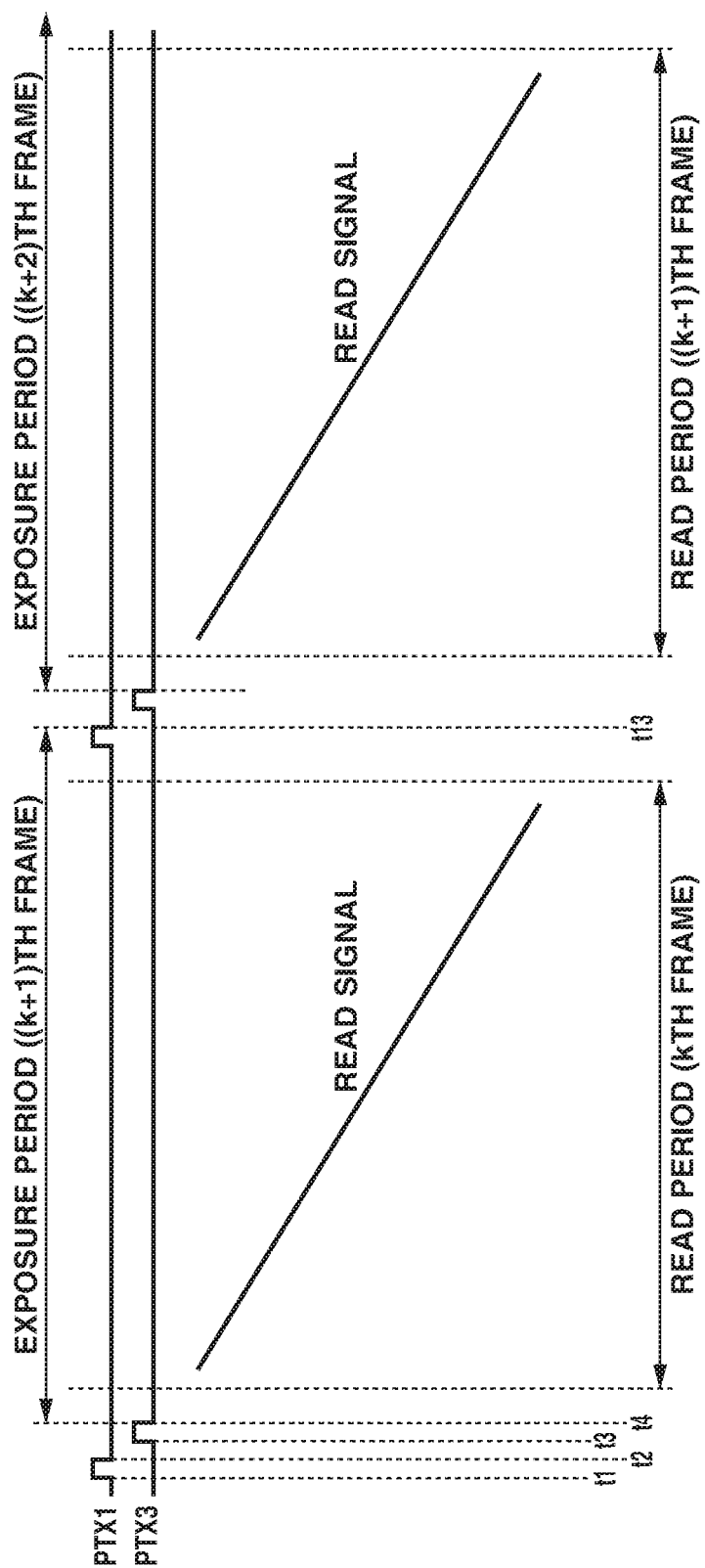

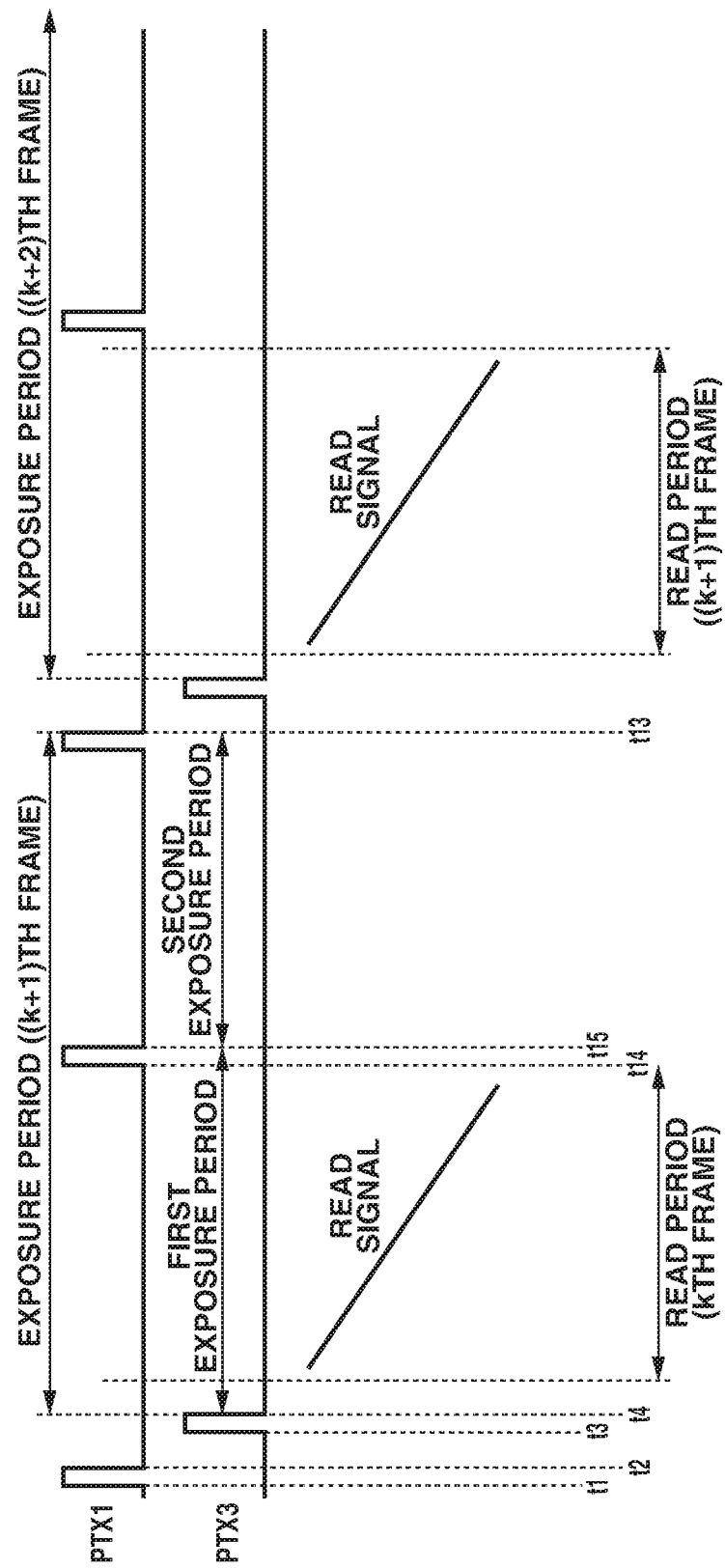

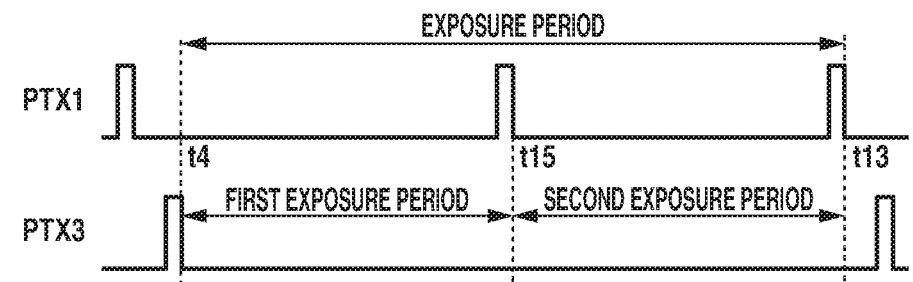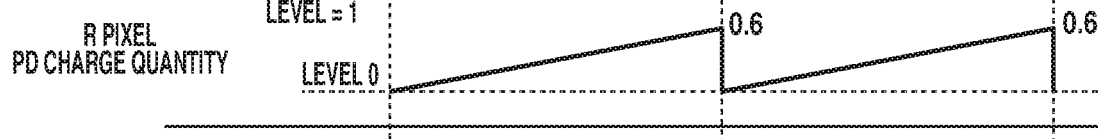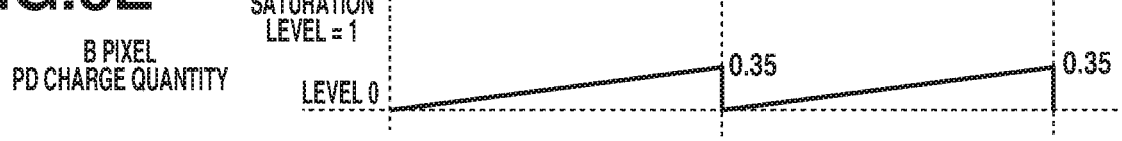

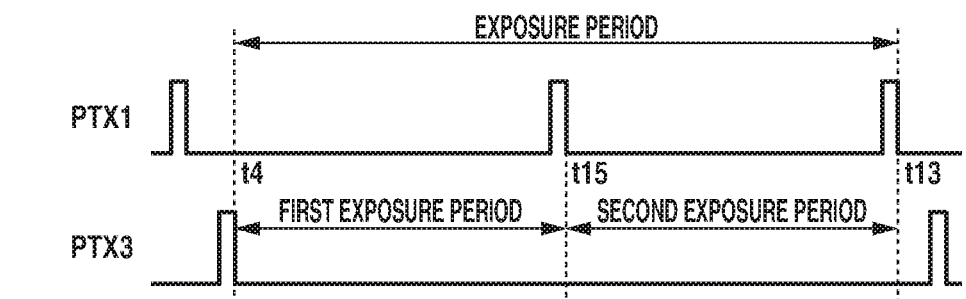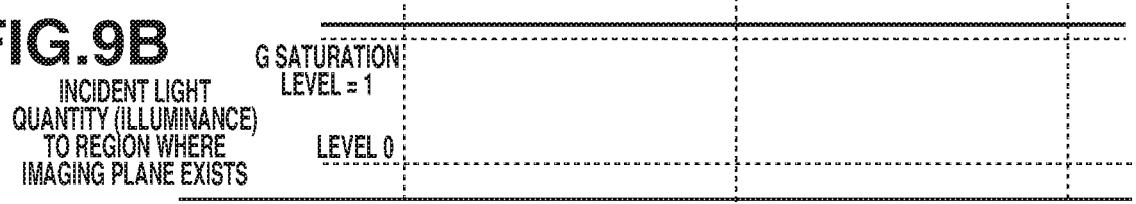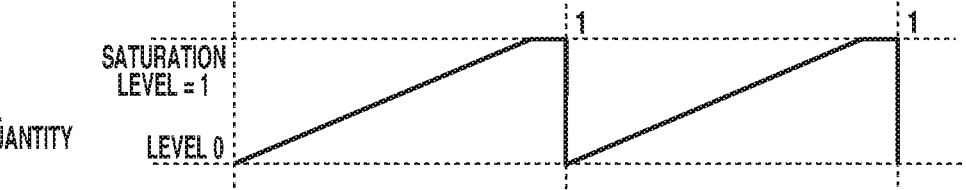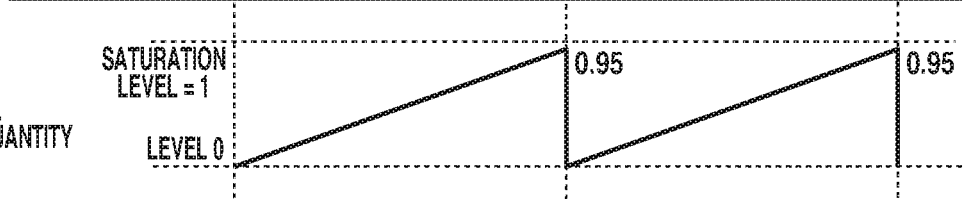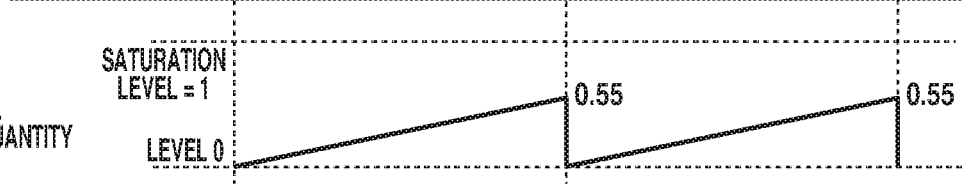

INCIDENT LIGHT
QUANTITY (ILLUMINANCE)
TO REGION WHERE
IMAGING PLANE EXISTS

G PIXEL
PD CHARGE QUANTITY

R PIXEL
PD CHARGE QUANTITY

B PIXEL
PD CHARGE QUANTITY

INCIDENT LIGHT
QUANTITY (ILLUMINANCE)
TO REGION WHERE
IMAGING PLANE EXISTS

G PIXEL
PD CHARGE QUANTITY

R PIXEL
PD CHARGE QUANTITY

B PIXEL
PD CHARGE QUANTITY

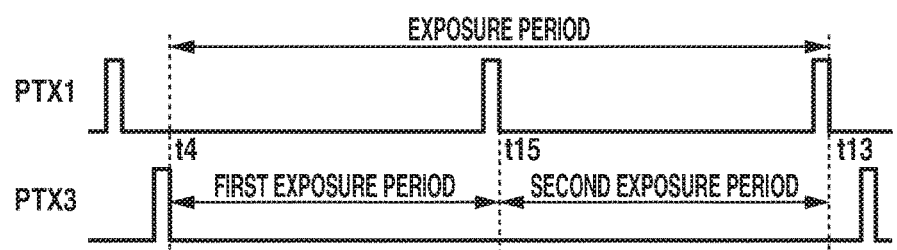
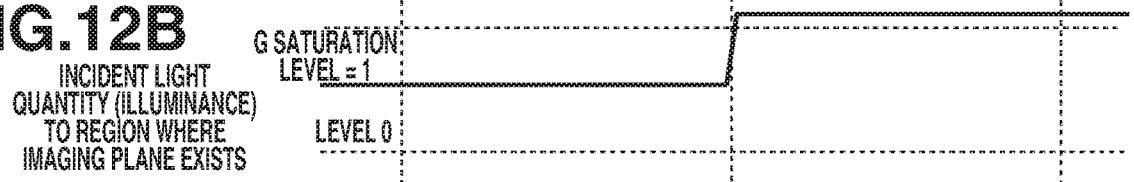
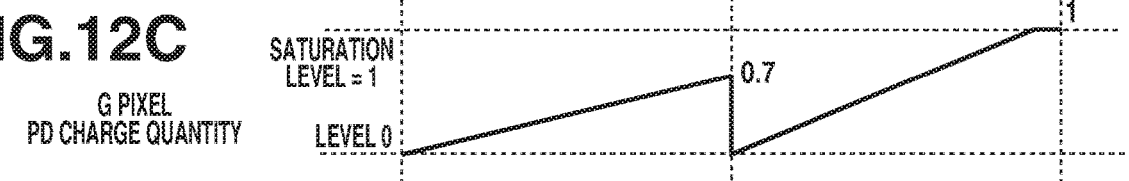
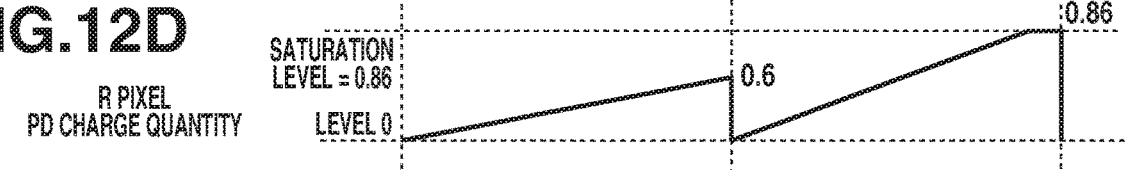

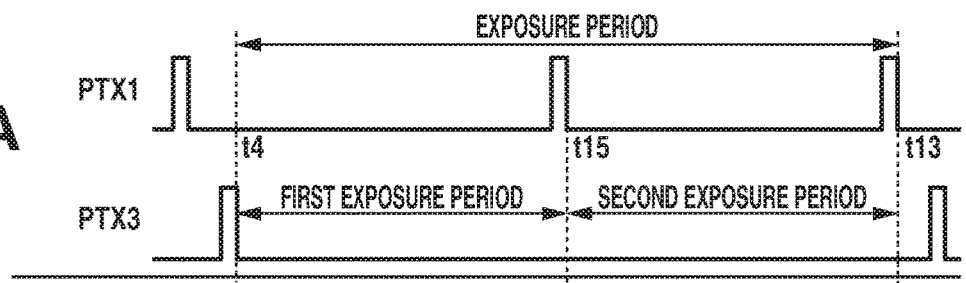

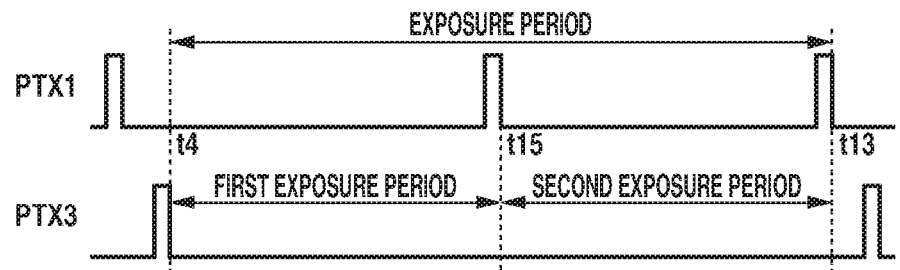
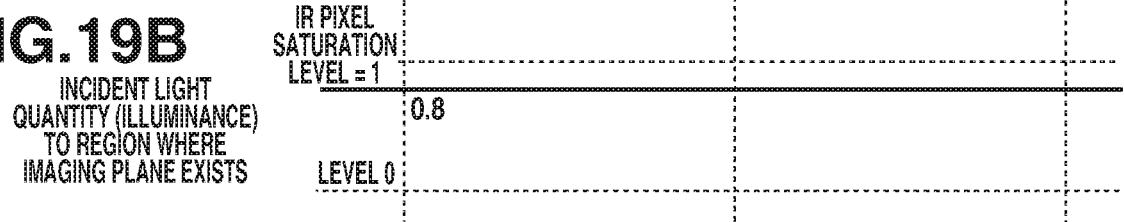
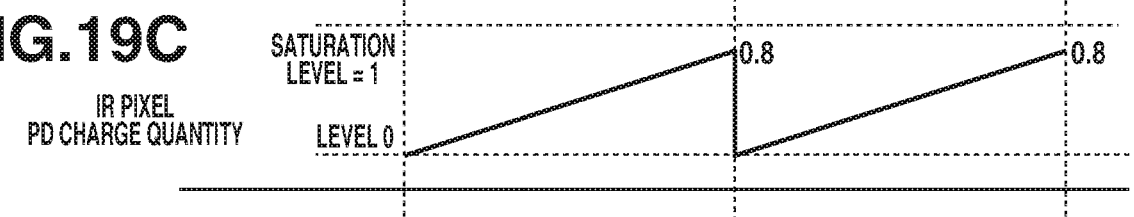
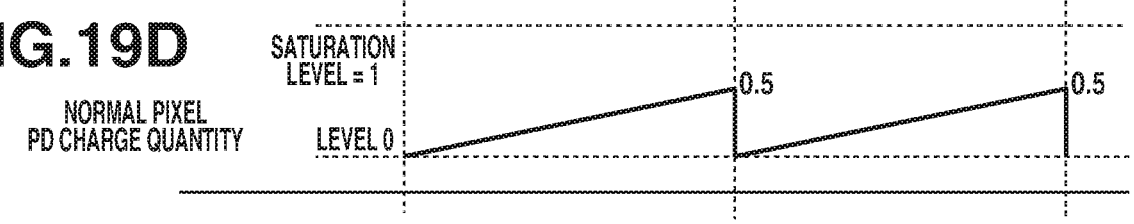

INCIDENT LIGHT QUANTITY (ILLUMINANCE) TO REGION WHERE IMAGING PLANE EXISTS

IR PIXEL PD CHARGE QUANTITY

NORMAL PIXEL PD CHARGE QUANTITY

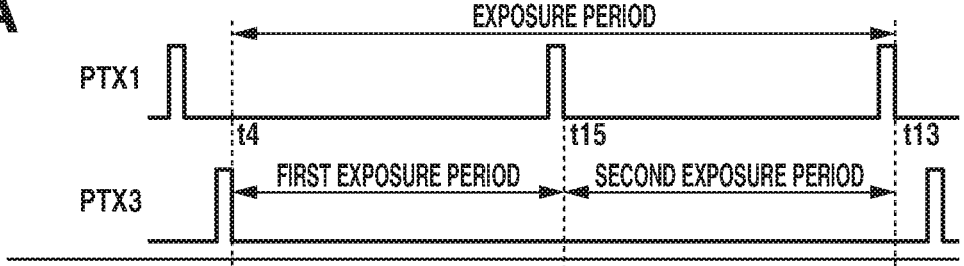
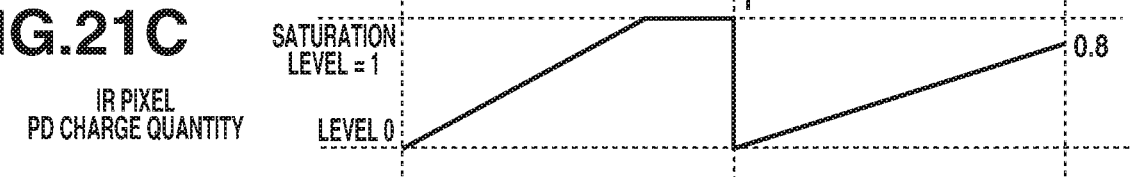
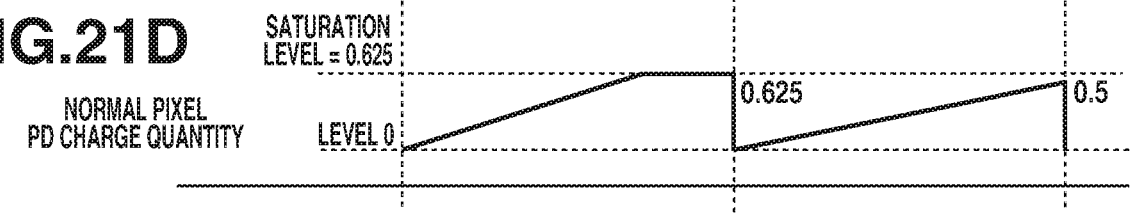

IMAGING APPARATUS, IMAGING SYSTEM, AND MOBILE OBJECT HAVING PIXELS WITH DIFFERENT SATURATION CHARGE QUANTITIES

BACKGROUND

Field of the Invention

The present disclosure relates to an imaging apparatus, an imaging system, and a mobile object.

Description of the Related Art

In recent years, a global electronic shutter operation by a complementary metal oxide semiconductor (CMOS) image sensor has been proposed. In an imaging apparatus that performs the global electronic shutter operation, an electric charge accumulation operation in the photoelectric conversion for acquiring one frame starts and ends simultaneously among pixels (exposure start time is the same among pixels and exposure end time is also the same among pixels). Using a global electronic shutter operation is advantageous in that a subject image is not distorted even when capturing a quickly moving subject.

Japanese Patent Application Laid-Open No. 2015-177349 discusses an imaging apparatus having a global electronic shutter function. In the imaging apparatus discussed in Japanese Patent Application Laid-Open No. 2015-177349, in a first period which starts at an exposure start time in an exposure period for acquiring one frame, electric charges generated by the photoelectric conversion in the first period are accumulated in a photoelectric conversion portion. At the exposure start time, a holding portion holds electric charges accumulated in an exposure period for acquiring the preceding frame. In the first period, an operation for reading the electric charges is sequentially performed for each pixel. At the end of the first period, electric charges are transferred from the photoelectric conversion portion to the holding portion in each pixel. In a second period following the first period, electric charges generated by the photoelectric conversion in the second period are accumulated by the photoelectric conversion portion or by both the photoelectric conversion portion and the holding portion.

In the imaging apparatus discussed in Japanese Patent Application Laid-Open No. 2015-177349, electric charges are transferred in this way from the photoelectric conversion portion to the holding portion during an exposure period for acquiring one frame. This configuration implements a global electronic shutter operation for improving the saturation charge quantity of pixels while preventing degradation of image quality.

SUMMARY

According to an aspect of the present disclosure, an imaging apparatus includes a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, and a second transfer switch configured to transfer the electric charges from the holding portion to the amplification portion, and. The imaging apparatus includes output lines connected to the plurality of pixels. At a first time, the photoelectric conversion portions of the plurality of pixels start accumulating the electric charges. From the first time to a second time, the first transfer switch of at least one of the plurality of pixels is kept OFF, and the photoelectric conversion portion of the at least one of the plurality of pixels accumulates electric charges generated in a first period that starts at the first time and ends at the second time. The first transfer switches of the plurality of pixels are controlled to turn ON from OFF by the second time at the latest. At a third time following the second time, the holding portions of the plurality of pixels hold both electric charges generated in the photoelectric conversion portion in the first period and electric charges generated in the photoelectric conversion portion in a second period that starts at the second time and ends at the third time. The plurality of pixels includes a first pixel and a second pixel. A saturation charge quantity of the photoelectric conversion portion of the first pixel is different from a saturation charge quantity of the photoelectric conversion portion of the second pixel.

Further features of the present invention will become apparent from the following description of exemplary embodiments with reference to the attached drawings.

BRIEF DESCRIPTION OF THE DRAWINGS

FIG. 3 is a schematic diagram illustrating a cross-sectional structure of the imaging apparatus.

FIGS. 5A to 5F are schematic graphs illustrating potential states of each portion of a pixel of the imaging apparatus in the first drive mode.

FIG. 6 is a diagram illustrating drive pulses of the imaging apparatus in the first drive mode.

FIG. 7 is a diagram illustrating drive pulses of the imaging apparatus in a second drive mode.

FIGS. 8A to 8E are schematic diagrams illustrating drive pulses of the imaging apparatus and examples of electric charge quantities in pixel portions in the second drive mode.

FIGS. 9A to 9E are schematic diagrams illustrating drive pulses of the imaging apparatus and examples of electric charge quantities in pixel portions in the second drive mode.

FIGS. 12A to 12E are schematic diagrams illustrating drive pulses of the imaging apparatus and examples of electric charge quantities in pixel portions in the second drive mode.

FIGS. 13A to 13E are schematic diagrams illustrating drive pulses of the imaging apparatus and examples of electric charge quantities in pixel portions in the second drive mode.

FIGS. 19A to 19D are schematic diagrams illustrating drive pulses of the imaging apparatus and examples of electric charge quantities in pixel portions in the second drive mode.

FIGS. 21A to 21D are schematic diagrams illustrating drive pulses of the imaging apparatus and examples of electric charge quantities in pixel portions in the second drive mode.

DESCRIPTION OF THE EMBODIMENTS

Figure 1:
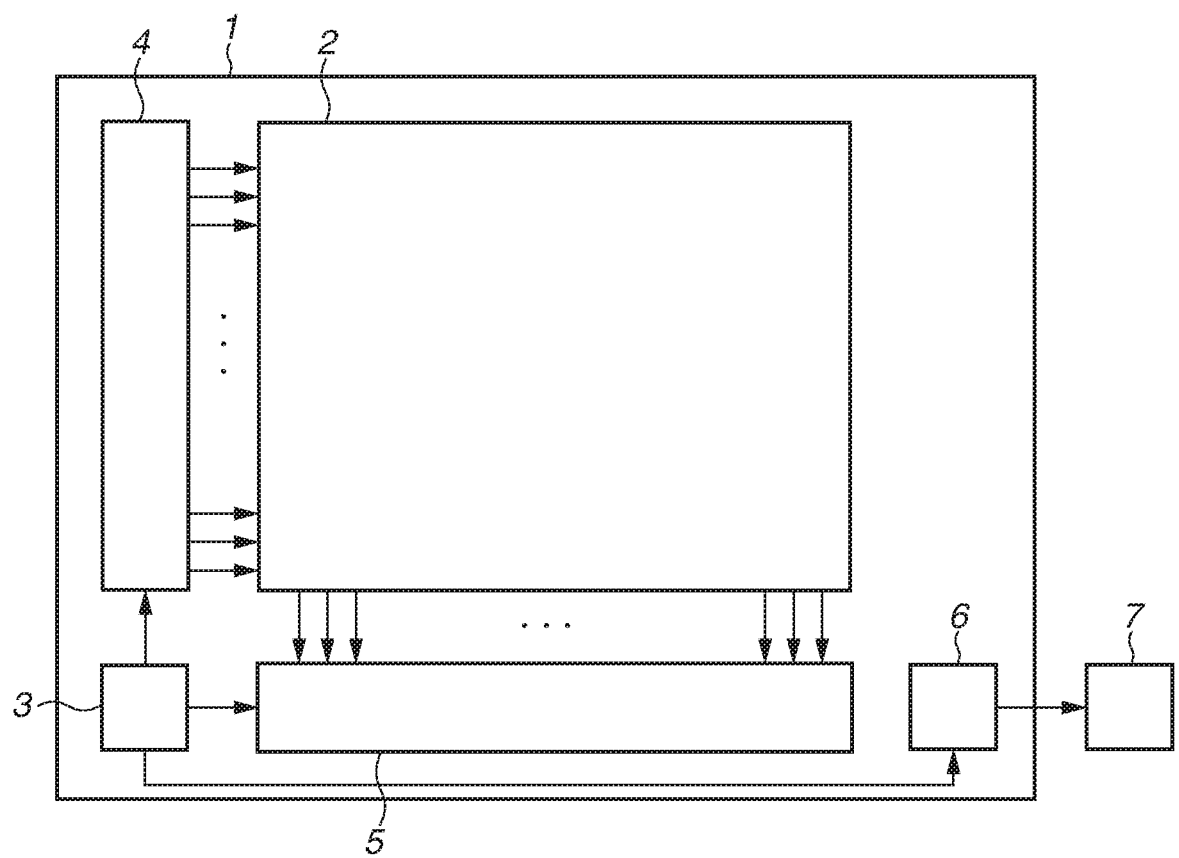
FIG. 1 is a block diagram illustrating a configuration of an imaging apparatus.

In an imaging apparatus discussed in Japanese Patent Application Laid-Open No. 2015-177349, in a case where the light quantity largely changes during an exposure period for acquiring one frame, for example, when an image of a quickly moving subject is captured, the output ratio of a signal output from each pixel may deviate from the appropriate output ratio. Therefore, there has been a problem of degradation of image quality. According to some exemplary embodiments of the present disclosure, it is possible to improve image quality.

The imaging apparatus according to an exemplary embodiment of the present disclosure is provided with a plurality of pixels, and output lines connected to the plurality of pixels. Signals from the plurality of pixels are output to the output lines. Each of the plurality of pixels includes a photoelectric conversion portion, a holding portion for storing electric charges, and an amplification portion for outputting a signal based on electric charges. Each pixel further includes a first transfer switch for transferring electric charges from the photoelectric conversion portion to the holding portion, and a second transfer switch for transferring electric charges from the holding portion to the amplification portion. Such a configuration enables performing an imaging operation in which the photoelectric conversion period is identical between the plurality of pixels, i.e., a global electronic shutter operation. The electronic shutter operation refers to electrically controlling the accumulation of electric charges generated by incident light.

According to some exemplary embodiments of the present disclosure, the photoelectric conversion portions of the plurality of pixels simultaneously start accumulating electric charges at the first time (start the exposure period of the kth frame, where k is a positive integer equal to or larger than 2). From the first to the second time, the first transfer switch remains OFF in at least one pixel. In the at least one pixel, electric charges generated in this period are accumulated in the photoelectric conversion portion. The period from the first to the second time is the first period.

In the first period, the amplification portion sequentially outputs signals based on electric charges held in the holding portions of the plurality of pixels to the output line. In other words, each pixel outputs a signal at least once in the first period. More specifically, in the first period, the second transfer switches of the plurality of pixels sequentially turn ON. Electric charges generated in the first period are accumulated in the photoelectric conversion portion. Therefore, in the first period, the holding portion can hold electric charges generated before the first time. More specifically, electric charges held by the holding portion in the first time are electric charges generated by the photoelectric conversion portion in the exposure period of the preceding frame, i.e., the (k−1)th frame.

The number of signals output in the first period may be changed depending on the format of the image to be output. For example, when capturing a moving image, signals needs to be output for the number of horizontal lines used for one frame. According to such an exemplary embodiment, signals need to be output from not all the pixels included in an imaging apparatus.

After signals from the plurality of pixels have been output, the holding portions of the plurality of pixels hold electric charges in at least the second period from the second to the third time. At this timing, each holding portion holds electric charges generated in the first period and electric charges generated in the second period. At the third time, the control unit 3 controls turning OFF of the first transfer switches of the plurality of pixels from ON at the same time.

The photoelectric conversion portion needs to accumulate electric charges generated in at least the first period and therefore is able to maintain the saturation charge quantity for the pixel even if a saturation charge quantity of the photoelectric conversion portion is small. This configuration makes it possible to perform the global electronic shutter operation while the saturation charge quantity is maintained. According to some exemplary embodiments of the present disclosure, the second period during which the holding portions of the plurality of pixels hold electric charges is longer than the first period. This is because, since the second period is longer than the first period, the saturation charge quantity of the photoelectric conversion portion can be reduced.

According to some exemplary embodiments of the present disclosure, an imaging apparatus which performs the global electronic shutter operation for transmitting electric charges from the photoelectric conversion portion to the holding portion during the exposure period for acquiring one frame can prevent the deviation of the pixel output ratio.

Exemplary embodiments of the present disclosure will be described below with reference to the accompanying drawings. The exemplary embodiments according to the present disclosure are not limited only to the following exemplary embodiments. For example, an example case where a part of the configuration of any one of the following exemplary embodiments is added to other exemplary embodiments, and an example case where a part of the configuration thereof is replaced with a part of the configuration of other exemplary embodiments are also included in exemplary embodiments of the present disclosure. According to the following exemplary embodiments, a first conductivity type is the N type, and a second conductivity type is the P type. However, the first conductivity type may be the P type, and the second conductivity type may be the N type.

A first exemplary embodiment will be described below. FIG. 1 is a block diagram illustrating a configuration of the imaging apparatus. An imaging apparatus 1 can be configured by one chip by using a semiconductor substrate. The imaging apparatus 1 includes an imaging region 2 where a plurality of pixels is arranged. The imaging apparatus 1 further includes a control unit 3 for supplying control signals and power voltages to a vertical scanning unit 4, a signal processing unit 5, and an output unit 6.

The vertical scanning unit 4 supplies drive pulses to a plurality of pixels arranged in the imaging region 2. Normally, the vertical scanning unit 4 supplies drive pulses for each pixel row or for each of a plurality of pixel rows. The vertical scanning unit 4 can be configured by using shift registers or address decoders.

The signal processing unit 5 includes a column circuit, a horizontal scanning circuit, and a horizontal output line. The column circuit includes a plurality of circuit blocks for receiving signals of a plurality of pixels included in a pixel row selected by the vertical scanning unit 4. Each circuit block can include any one of a signal holding portion, an amplification circuit, a noise rejection circuit, and an analog-to-digital conversion circuit, or a combination thereof. The horizontal scanning circuit can be configured by using shift registers or address decoders.

The output unit 6 outputs the signal transmitted via the horizontal output line, to the outside of the imaging apparatus 1. The output unit 6 includes a buffer or an amplification circuit and outputs a signal from each pixel to the signal processing unit 7. The signal processing unit 7 performs signal processing on the signal from each pixel. Typically, the signal processing unit 7 performs processing for generating a developed image by multiplying the signal from each pixel by the gain according to the white balance. The signal processing unit 7 may be included in the imaging apparatus 1.

(Pixel Structure)

Figure 2:
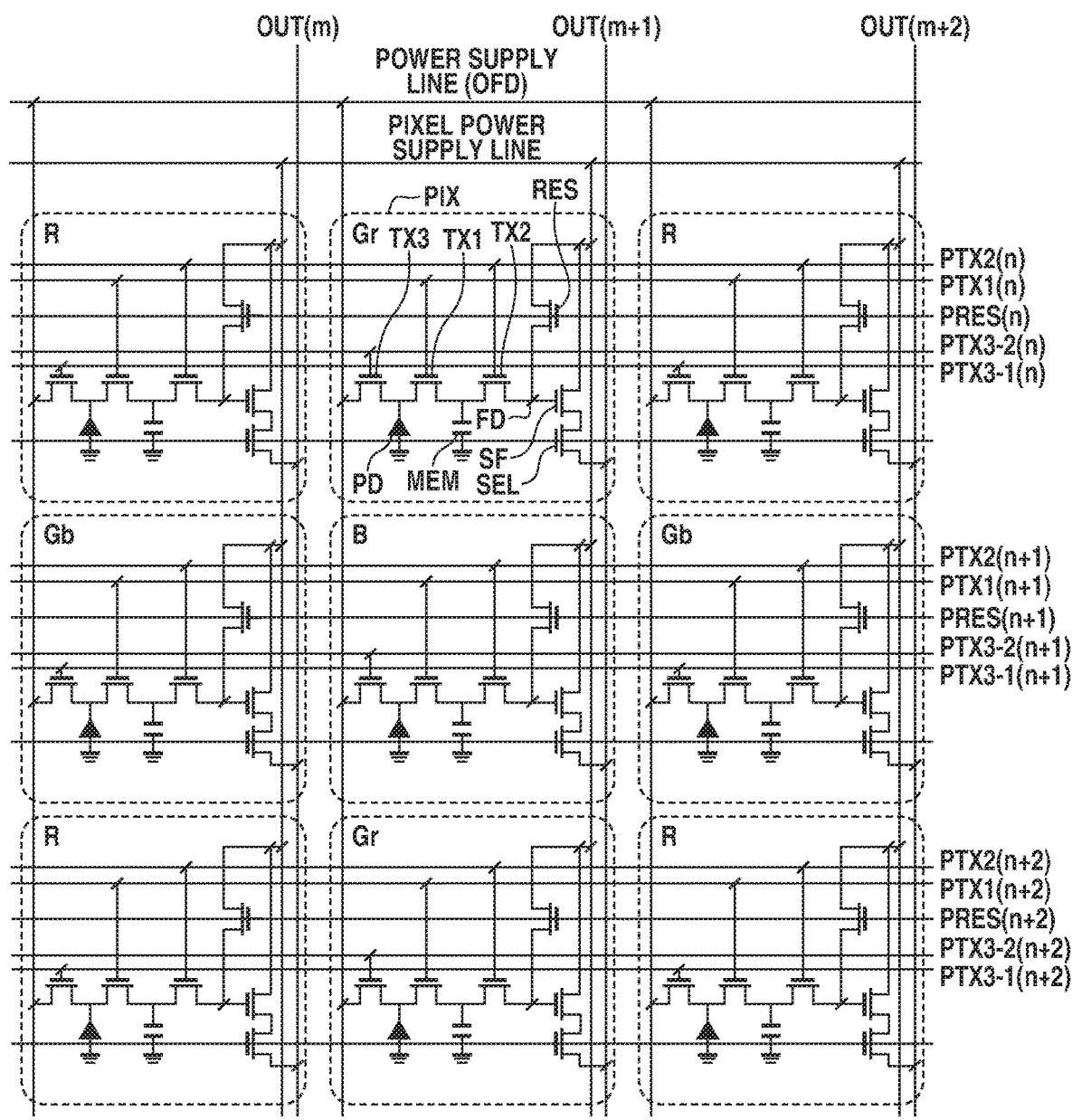
FIG. 2 is a diagram illustrating an equivalent circuit of the imaging apparatus.

FIG. 2 is a diagram illustrating an equivalent circuit of a pixel included in the imaging region 2 of the imaging apparatus 1. To simplify descriptions, it is assumed that the imaging region 2 includes nine pixels arranged in a 3-by-3 matrix form including an nth to an (n+2)th rows and an mth to an (m+2)th columns. One pixel is enclosed in a dashed line and is referred to as PIX. Although nine pixels PIX are illustrated in FIG. 2, the imaging apparatus 1 includes a larger number of pixels.

Each pixel PIX includes a photoelectric conversion portion PD, a holding portion MEM, an amplification portion SF, a first transfer switch TX1, and a second transfer switch TX2. Each pixel PIX further includes a reset transistor RES and a selection transistor SEL.

The photoelectric conversion portion PD accumulates electric charges generated by incident light. The anode of the photoelectric conversion portion PD is grounded to a fixed potential, and the cathode thereof is connected to one terminal of the holding portion MEM via the first transfer switch TX1 as a first transfer portion. The first transfer switch TX1 transfers electric charges in the photoelectric conversion portion PD to the holding portion MEM. The cathode of the photoelectric conversion portion PD is connected to a power supply line as a second power supply which functions as an overflow drain (hereinafter referred to as an OFD) via a third transfer switch TX3 as a third transfer portion. The third transfer switch TX3 is a discharge switch for discharging electric charges in the photoelectric conversion portion PD.

The other terminal of the holding portion MEM is grounded to a fixed potential. One terminal of the holding portion MEM is also connected to the gate terminal of the amplification transistor as the amplification portion SF via the second transfer switch TX2 as a second transfer portion. The second transfer switch TX2 transfers electric charges in the holding portion MEM to a floating diffusion portion FD as the input node of the amplification portion SF. The gate terminal of the amplification portion SF is connected to a pixel power supply line as a first power supply via the reset transistor RES as a reset portion. The reset transistor RES resets the voltage of the floating diffusion portion FD as the input node of the amplification portion SF. The selection transistor SEL selects the pixel PIX which outputs a signal to a vertical signal line OUT as an output line. The amplification portion SF outputs a signal based on electric charges generated by incident light to the vertical signal line OUT. The amplification portion SF is, for example, a source follower circuit. Each of the first transfer switch TX1, the second transfer switch TX2, and the discharge switch TX3 is a metal oxide semiconductor (MOS) transistor. Referring to FIG. 2, the pixel power supply line suppling the power voltage for the amplification portion SF and the power supply line which functions as an OFD are separated. However, they may be collectively replaced with a common power supply line.

One main electrode of the selection transistor SEL is connected to the vertical signal line, and the other main electrode thereof is connected to one main electrode of the amplification portion SF (transistor). When an active signal PSEL is input to the control electrode of the selection transistor SEL, both main electrodes of the selection transistor SEL enter the conducting state. The amplification portion SF and a constant-current source (not illustrated) disposed on the vertical signal line OUT form a source follower circuit. A signal according to the potential of the gate terminal (control electrode) of the amplification portion SF appears on the vertical signal line OUT. A signal is output from the imaging apparatus 1 based on the signal appearing on the vertical signal line OUT, i.e., the signal output from the pixel PIX. The floating diffusion portion FD as an input node is commonly connected with the gate terminal of amplification portion SF and the main electrodes of the reset transistor RES and the second transfer switch TX2. Therefore, the floating diffusion portion FD has a capacitance value and is capable of storing electric charges.

The imaging apparatus 1 according to the present exemplary embodiment is a color sensor in which each pixel PIX is provided with a color filter. As illustrated in FIG. 2, pixels PIX with red (R), green (Gr, Gb), and blue (B) color filters included therein are arranged in Bayer arrangement, with the color of the color filter indicated at the upper left for each pixel. In the imaging apparatus 1 according to the present exemplary embodiment, each row is provided with two different gate drive lines PTX3-1 and PTX3-2 of the discharge switch TX3. The red (R), green (Gr, Gb), and blue (B) pixels PIX are connected to different drive lines by color of the color filters.

According to the present exemplary embodiment, in an nth row, the gate drive line PTX3-1($n$) is connected to the red (R) pixels PIX, and the gate drive line PTX3-2($n$) is connected to the green (Gr) pixel PIX. In an (n+1)th row, the gate drive line PTX3-1($n$+1) is connected to the green (Gb) pixels PIX, and the gate drive line PTX3-2$n$+1) is connected to the blue (B) pixel PIX. The gate drive line PTX3-2($n$) for driving the green (Gr) pixels PIX and the gate drive line PTX3-1($n$+1) for driving the green (Gb) pixels PIX are identical in a region (not illustrated).

FIG. 3 is a schematic diagram illustrating a cross-sectional structure of the imaging apparatus. More specifically, FIG. 3 illustrates a cross-section of one pixel. Referring to FIG. 3, portions having the same function as the portions illustrated in FIG. 2 are assigned the same reference numerals. Although FIG. 3 illustrates a front-side illuminated imaging apparatus, the imaging apparatus is not limited thereto and may be a back-side illuminated imaging apparatus. In addition, the conductive type of each semiconductor region will be described below centering on an example case where electrons are used as signal electric charges. When using holes as signal electric charges, the conductive type of each semiconductor region needs to be the opposite conductivity type.

The photoelectric conversion portion PD has an embedded photo-diode structure. The photoelectric conversion portion PD includes an N-type semiconductor region 202 and a P-type semiconductor region 203. The N-type semiconductor region 202 and the P-type semiconductor region 203 form a PN junction. By the P-type semiconductor region 203, interface noise can be prevented.

The P-type semiconductor region 201 is disposed around the N-type semiconductor region 202. The P-type semiconductor region 201 may be formed by implanting P-type impurity ions into an N-type semiconductor substrate or by using a P-type semiconductor substrate.

The holding portion MEM includes an N-type semiconductor region 205. Signal electric charges are held in the N-type semiconductor region 205. A P-type semiconductor region may be disposed between the N-type semiconductor region 205 and the front face of the semiconductor substrate. With such an arrangement, the holding portion MEM has an embedded structure.

A gate electrode 207 configures the gate of the first transfer switch TX1. An N-type semiconductor region 213 is disposed under the gate electrode 207 via a gate insulation film. The impurity concentration of the N-type semiconductor region 213 is lower than the impurity concentration of the N-type semiconductor region 202. The potential state between the photoelectric conversion portion FD and the holding portion MEM can be controlled by the voltage supplied to the gate electrode 207.

An N-type semiconductor region 208 configures the floating diffusion portion FD. The N-type semiconductor region 208 is electrically connected with the gate of the amplification portion SF via a plug 209.

A gate electrode 204 configures the gate of the second transfer switch TX2. The potential state between the holding portion MEM and the floating diffusion portion FD can be controlled by the voltage supplied to the gate electrode 204.

The holding portion MEM is shaded by a light shielding portion 210. The light shielding portion 210 is made of a metal such as tungsten, aluminum, and other materials having low transmittance of light in the visible light region. The light shielding portion 210 covers at least the holding portion MEM. As illustrated in FIG. 3, the light shielding portion 210 may cover the entire gate electrode 207 of the first transfer switch TX1 and may be extended to a part of the upper portion of the gate electrode 204 of the second transfer switch TX2. This configuration makes it possible to further improve the shielding function of the light shielding portion 210. A color filter CF and a micro lens ML are disposed above the opening of the light shielding portion 210. More specifically, in each pixel PIX, the color filter CF and the micro lens ML are disposed on the upstream side of the photoelectric conversion portion PD in the incident direction of incident light.

An N-type semiconductor region 212 configures a part of an OFD region. A plug 215 supplies the power voltage to the N-type semiconductor region 212 and is connected with the second power supply which functions as the OFD.

A gate electrode 211 configures the gate of the discharge switch TX3. The potential state between the photoelectric conversion portion PD and the OFD region can be controlled by the voltage supplied to the gate electrode 211.

(Driving Method)

A method for driving the imaging apparatus will be described below. A description will be given of a first drive mode and a second drive mode for the method for driving the imaging apparatus. In both the first and the second drive modes, the global electronic shutter operation including the accumulation of electric charges by the photoelectric conversion portion PD and electric charge transfer from the photoelectric conversion portion PD to the holding portion MEM is performed. The difference between the first and the second drive modes is the timing of electric charge transfer. More specifically, in the first drive mode, the control unit 3 performs electric charge transfer from the photoelectric conversion portion PD to the holding portion MEM at the end of the exposure period. In the second drive mode, the control unit 3 performs electric charge transfer from the photoelectric conversion portion PD to the holding portion MEM during the exposure period. The imaging apparatus according to the present exemplary embodiment operates at least in the second drive mode.

The imaging apparatus according to the present exemplary embodiment may have a drive mode for performing a rolling shutter operation. In the drive mode for the rolling shutter operation, the photoelectric conversion portion PD of each of the plurality of pixels sequentially starts accumulating electric charges. Subsequently, the control unit 3 sequentially controls turning ON of the first transfer switches TX1 of the plurality of pixels.

(First Drive Mode)

The first drive mode for performing the global electronic shutter operation will be described below with reference to FIGS. 4 to 6. In the first drive mode, the photoelectric conversion portion PD accumulates electric charges generated in the exposure period, and, at the end of the exposure period, the electric charges accumulated in the photoelectric conversion portion PD is transferred to the holding portion MEM.

Figure 4:
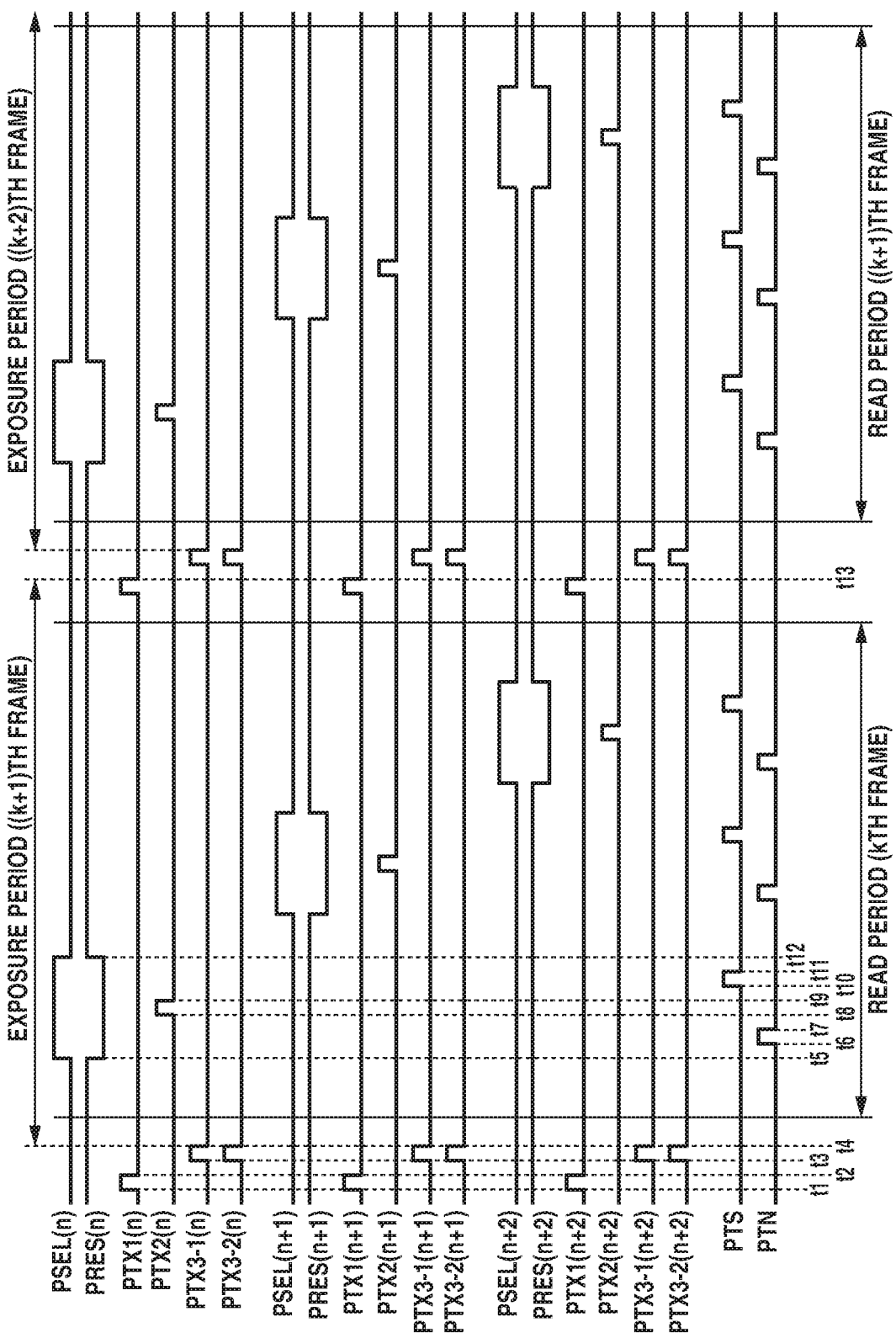
FIG. 4 is a timing chart illustrating drive pulses of the imaging apparatus in a first drive mode.
Figure 10A:
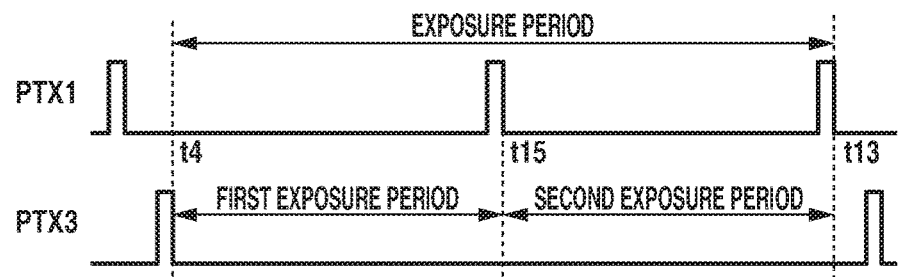
FIGS. 10A to 10E are schematic diagrams illustrating drive pulses of the imaging apparatus and examples of electric charge quantities in pixel portions in the second drive mode.
Figure 10B:
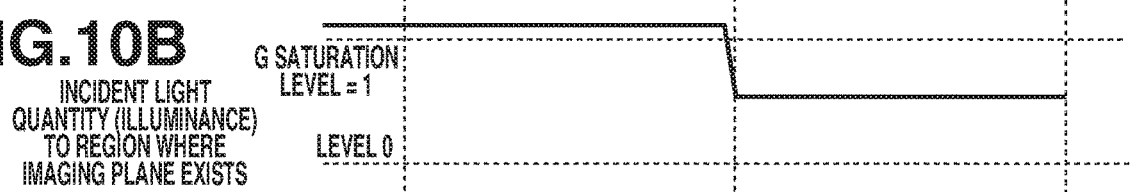
Figure 10C:
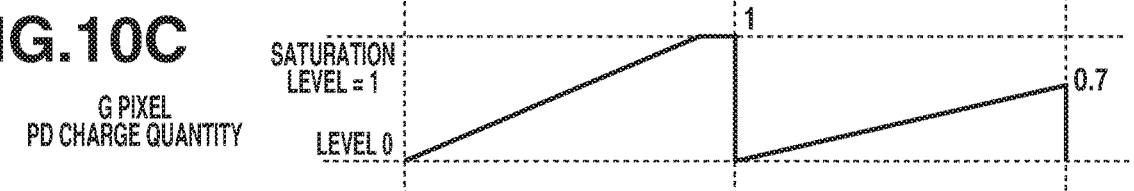
Figure 10D:
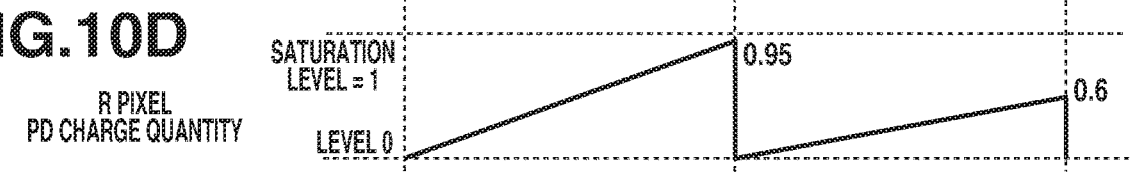
Figure 10E:
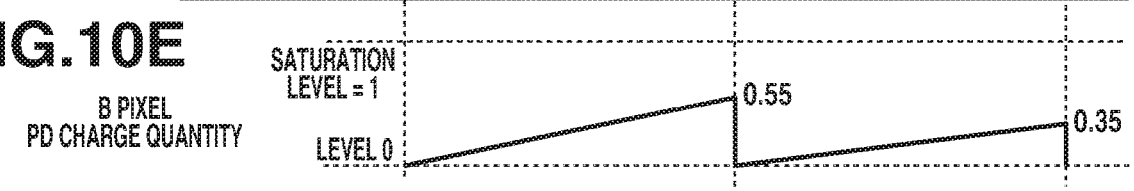
Figure 11A:
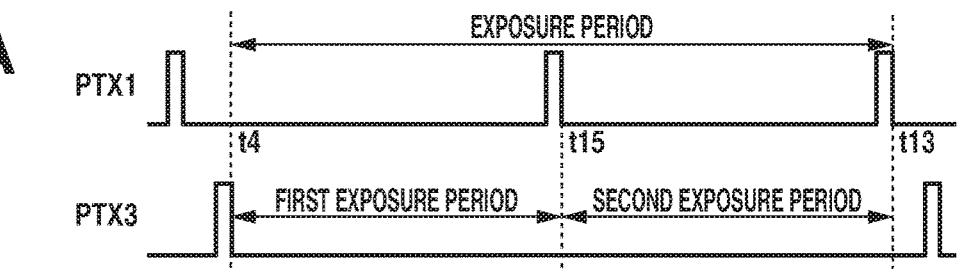
FIGS. 11A to 11E are schematic diagrams illustrating drive pulses of the imaging apparatus and examples of electric charge quantities in pixel portions in the second drive mode.
Figure 11B:
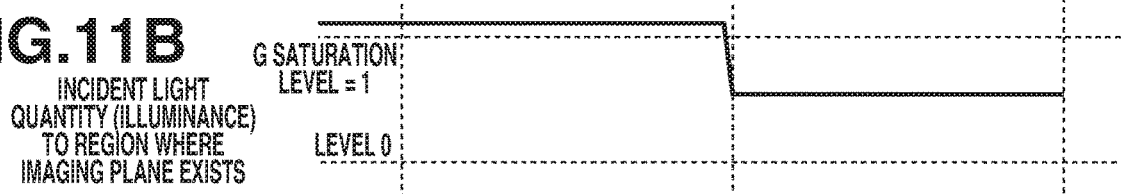
Figure 11C:
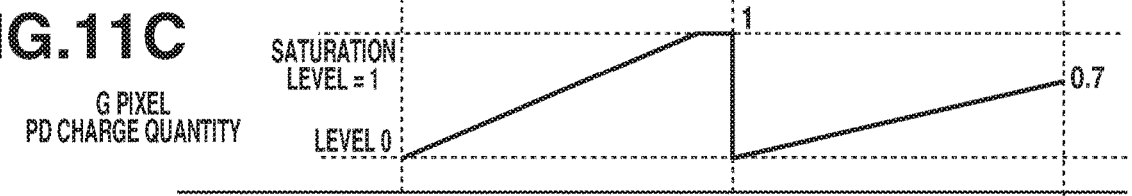
Figure 11D:
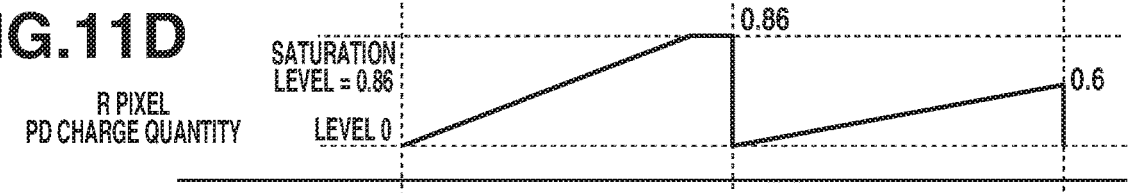
Figure 11E:
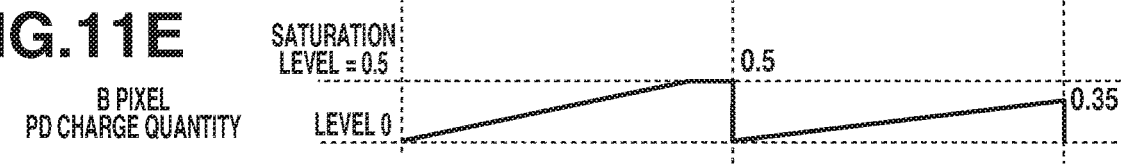

FIG. 4 is a diagram schematically illustrating drive pulses in the first drive mode. FIG. 4 illustrates drive pulses supplied to the selection transistor SEL, the reset transistor RES, the first transfer switch TX1, the second transfer switch TX2, and the discharge switch TX3 in each pixel in the nth to (n+2)th rows. When a drive pulse is at the high level, the corresponding transistor or switch turns ON. When a drive pulse is at the low level, the corresponding transistor or switch turns OFF. These drive pulses are supplied by the control unit 3 included in the imaging apparatus 1.

FIGS. 5A to 5F are schematic graphs illustrating potential states, i.e., potentials to electrons of each portion of a pixel at each timing. In each of the graphs, a higher potential to electrons, i.e., a lower electric potential, is plotted on a higher end of the graph. FIGS. 5A to 5F illustrate potentials of the OFD, the discharge switch TX3, the photoelectric conversion portion PD, the first transfer switch TX1, the holding portion MEM, the second transfer switch TX2, and the floating diffusion portion PD (see FIGS. 2 and 3) from left to right.

Exposure for the preceding frame is performed before the time t2. Exposure indicates that electric charges generated by the photoelectric conversion are accumulated or held as a signal.

Before the time t1, the photoelectric conversion portion PD is irradiated with light, and electric charges corresponding to the light quantity of the incident light to the photoelectric conversion portion PD are accumulated in the photoelectric conversion portion PD in the period until the time t1. The state is schematically illustrated in FIG. 5A.

In the period from the time t1 to the time t2, first transfer switch control signals PTX1($n$), PTX1($n$+1), and PTX1($n$+2) (hereinafter collectively referred to as "PTX1") becomes the high level, and the first transfer switch TX1 turns ON. Consequently, electric charges accumulated in the photoelectric conversion portion PD are transferred to the holding portion MEM. This state is schematically illustrated in FIG. 5B. At the time t2, PTX1 becomes the low level again and the transfer operation is completed. This state at this timing is schematically illustrated in FIG. 5C. The operation for electric charge transfer from the photoelectric conversion portion PD to the holding portion MEM is performed for all the pixels at the same time. To end exposure for the preceding frame in the first drive mode, the control unit 3 controls turning OFF of the first transfer switch TX1, which transfers electric charges from the photoelectric conversion portion PD to the holding portion MEM, from ON for all the pixels at the same time (at the time t2 illustrated in FIG. 4).

In the period from the time t3 to the time t4, discharge switch control signals PTX3-1($n$), PTX3-1($n$+1), PTX3-1($n$+2), and PTX3-2($n$) PTX3-2$n$+1) and PTX3-2$n$+2) (hereinafter collectively referred to as "PTX3") become the high level, and electric charges are discharged from the photoelectric conversion portion PD to the OPD. The state is schematically illustrated in FIG. 5D. This operation for discharging electric charges from the photoelectric conversion portion PD to the OFD is performed for all the pixels at the same time. To start exposure in the first drive mode, the control unit 3 controls turning OFF of the discharge switch TX3 which transfers electric charges from the photoelectric conversion portion PD to the holding portion MEM, from ON for all the pixels at the same time (at the time t4 illustrated in FIG. 4).

In the first drive mode, the control unit 3 discharges electric charges from the photoelectric conversion portion PD to the OFD and transfers electric charges from the photoelectric conversion portion PD to the holding portion MEM for all the pixels at the same time. With this configuration, the imaging apparatus can perform an imaging operation in which the photoelectric conversion period is identical between the plurality of pixels, i.e., a global electronic shutter operation.

An operation for reading electric charges transferred from the photoelectric conversion portion PD to the holding portion MEM will be described below. While a description will be given of a case where, an operation for reading the signal of the preceding frame is started after exposure (accumulation of electric charges in the photoelectric conversion portion PD) for the following frame is started at the timing of when the control unit 3 controls turning OFF of the discharge switch TX3 from ON, the operation is not limited thereto.

At the time t5, the control unit 3 controls turning OFF of the reset transistor RES(n) of the floating diffusion portion FD from ON to cancel the reset state of the floating diffusion portion FD. At the same time, when a row selection control signal PSEL(n) becomes the high level, the selection transistor SEL(n) turns ON, and the pixels in the nth row are selected. Consequently, the voltage corresponding to the potentials of the floating diffusion portions PD of the pixels in the nth row is output to the vertical signal line OUT.

In the period from the time t6 to the time t7, a reset noise selection signal PTN becomes the high level. At this timing, the column circuit included in the signal processing unit 5 samples and holds the reset noise levels of the floating diffusion portions FD of the pixels in the nth row. Consequently, a noise signal read operation (N read) is performed.

In the period from the time t8 to the time t9, the second transfer switch control signal PTX2($n$) becomes the high level, and the second transfer switches TX2 of the pixels in the nth row turn ON. Consequently, electric charges accumulated in the holding portion MEM are transferred to the floating diffusion portion PD. The state is illustrated in FIG. 5E. At the time t9, the second transfer switch control signal PTX2($n$) becomes the low level, and the second transfer switches TX2 of the pixels in the nth row turn OFF. This completes the operation for electric charge transfer from the holding portion MEM to the floating diffusion portion PD. This operation completion state is illustrated in FIG. 5F.

At the time t9, the operation for electric charge transfer from the holding portion MEM to the floating diffusion portion FD is completed. Then, a potential having a level (optical signal level) increased by adding the potential corresponding to electric charges accumulated in the floating diffusion portion FD to the reset level is output to the vertical signal line OUT. In the period from the time t10 to the time t11, an image signal selection signal PTS becomes the high level, and the column circuit samples and holds this optical signal level. Accordingly, an optical signal read operation (S read) is performed. The reset noise level previously sampled and held is subtracted from the optical signal level, and the resultant level is output to the subsequent stage as an image signal without noise.

At the time t12, the selection transistor SEL(n) turns OFF, the reset transistor RES(n) turns ON, and the potentials of the floating diffusion portions PD of the pixels in the nth row are reset again.

According to the above-described drive pulses, a series of read operations including pixel selection, reset, noise signal read (N read), electric charge transfer to the floating diffusion portion FD, and optical signal read (S read) is performed for each pixel row. The output signal may be subjected to analog-to-digital (A/D) conversion outside the imaging apparatus or inside the imaging apparatus. As illustrated in FIG. 4, following the nth row, the control unit 3 also sequentially performs the read operation for the pixels in the (n+1)th and (n+2)th rows.

According to the present specification, the period during which "noise signal read (N read), electric charge transfer to the floating diffusion portion FD, and optical signal read (S read)" are performed in each pixel row is defined as a "read period". Referring to FIG. 4, the read period on the left-hand side of the timing chart indicates the read period for the kth frame, and the subsequent read period on the right-hand side of the timing chart indicates the read period for the (k+1)th frame. According to the present specification, the period during which the photoelectric conversion portion PD of each pixel accumulates electric charges corresponding to one frame is defined as an "exposure period". According to the present exemplary embodiment, the period from the time t4 of when discharge of electric charges to the OFD is completed to the time t13 of when electric charge transfer to the holding portion MEM is completed is the exposure period for the (k+1)th frame. As illustrated in the upper and lower sides of the timing chart illustrated in FIG. 4, according to the present exemplary embodiment, the read period for the kth frame and the exposure period for the (k+1)th frame are at least partially overlapped with each other.

In the subsequent descriptions, drive pulses supplied to each portion in a pixel to perform a series of operations including "noise signal read (N read), electric charge transfer to the floating diffusion portion PD, and optical signal read (S read)" are collectively referred to as a "read signal". FIG. 6 is a diagram illustrating drive pulses of the imaging apparatus in the first drive mode. The oblique lines indicate that read operations are sequentially performed for each row. While the first transfer switch control signal PTX1 and the discharge switch control signal PTX3 are supplied for all the pixels at the same time, FIG. 6 illustrates one first transfer switch control signal PTX1 and one discharge switch control signal PTX3 for all the pixels in a collective way. Although FIG. 6 illustrates the same timing as FIG. 4, the timing illustrated in FIG. 6 is a simplified representation of the timing illustrated in FIG. 4 for use in a case of multi-pixel arrangement.

As described above, in the first drive mode, the control unit 3 performs electric charge transfer from the photoelectric conversion portion PD to the holding portion MEM at the end of the exposure period. Therefore, electric charge transfer from the photoelectric conversion portion PD to the holding portion MEM is performed only once during the exposure period for one frame. Such a drive is also referred to as one-time transfer drive.

(Second Drive Mode)

The second drive mode for performing the global electronic shutter operation will be described below with reference to FIG. 7. In the second drive mode, electric charges generated in the exposure period are accumulated in the photoelectric conversion portion PD and the electric charges accumulated in the photoelectric conversion portion PD are transferred to the holding portion MEM during the exposure period. After the first-time charge transfer to the holding portion MEM, the photoelectric conversion portion PD or both the photoelectric conversion portion PD and the holding portion MEM accumulate electric charges generated by the photoelectric conversion in subsequent periods. An example of the second drive mode will be described below centering on an example case where electric charge transfer from the photoelectric conversion portion PD to the holding portion MEM is performed twice in the exposure period for one frame. For operations equivalent to those in the first drive mode, redundant descriptions will be omitted. Such a drive is also referred to as two-time transfer drive.

FIG. 7 schematically illustrates drive pulses in the second drive mode. Similar to the first drive mode, exposure for the preceding frame is performed before the time t2, and, at the time t4, electric charges generated by the photoelectric conversion portion PD in the exposure period of the preceding frame are accumulated in the holding portion MEM. When the control unit 3 controls turning OFF of the discharge switch TX3 from ON at the time t4, an exposure period for the following frame is started. The time t4 is time when an exposure period is started, and is referred to as a first time.

The first transfer switch TX1 remains OFF from the first time (time t4) until the time when the first period elapses, i.e., at the second time (time t14). According to the present exemplary embodiment, while the first transfer switches TX1 of all the pixels remain OFF, the present exemplary embodiment is not limited thereto. Alternatively, in at least one pixel, the first transfer switch TX1 remains OFF from the first to the second time.

The time when the first period has elapsed since the first time (time t4) is the second time (time t14). More specifically, the period from the first time (time t4) to the second time (time t14) is the first period. In the first period, electric charges generated in the first period are accumulated in the photoelectric conversion portion PD.

In the first period, operations for reading electric charges corresponding to the preceding frame held in the holding portion MEM are sequentially performed. Read operations are sequentially performed so that the signal output corresponding to the preceding frame completes by the second time at the latest (i.e. completes before, or by, the second time).

At the second time (time t14), the control unit 3 turns ON the first transfer switch TX1. Accordingly, electric charges in the photoelectric conversion portion PD are transferred to the holding portion MEM. More specifically, after the second time, electric charges generated in the first period are held by the holding portion MEM. According to the present exemplary embodiment, the first transfer switches TX1 of all the pixels are turned ON from OFF at the same time. However, the first transfer switches TX1 of the plurality of pixels need to turn ON by the second time, and the transition timing may be different between the first transfer switches TX. For example, the control unit 3 may turn ON the first transfer switch TX1 in order of pixels in which the above-described read operation is completed.

The time when the second period has elapsed since the second time (time t14) is the third time (time t13). More specifically, the period from the second time (time t14) to the third time (time t13) is the second period. According to the present exemplary embodiment, at the time t15 after the time t14, the control unit 3 controls turning OFF of the first transfer switch TX1 from ON again. Electric charges generated in the second exposure from the time t15 to the time t13 are accumulated in the photoelectric conversion portion PD. In the second exposure period, electric charges generated in the first exposure period from the time t4 to the time t15 are held by the holding portion MEM. When the control unit 3 controls turning ON of the first transfer switch TX1 from OFF again at the time between the time t15 and the time t13, electric charges in the photoelectric conversion portion PD are transferred to the holding portion MEM. Therefore, at the third time (time t13), the holding portion MEM holds both electric charges generated in the first period and electric charges generated in the second period.

As described above, in the second drive mode, the next exposure can be started immediately after completion of exposure for one frame. Thus, periods during which information is missing can be eliminated, and image quality can be therefore improved.

In the second drive mode, after completion of operations for reading electric charges corresponding to the preceding frame held in the holding portion MEM, the control unit 3 performs electric charge transfer from the photoelectric conversion portion PD to the holding portion MEM during the exposure period. Consequently, the saturation charge quantity of pixels can be increased even with a small saturation charge quantity of the photoelectric conversion portion PD. The saturation charge quantity of pixels refers to the maximum value of the electric charge quantity which can be handled as a signal from among electric charges generated in a single exposure operation. The saturation charge quantity of the photoelectric conversion portion PD refers to the maximum value of the electric charge quantity which can be accumulated by the photoelectric conversion portion PD. The saturation charge quantity of the holding portion MEM refers to the maximum value of the electric charge quantity which can be held by the holding portion MEM.

A single exposure period is the sum total of the first and the second periods. Since electric charges of the preceding frame held by the holding portion MEM are read in the first period, electric charges can be held by the holding portion MEM when the first period ends. Thus, the photoelectric conversion portion PD needs to accumulate electric charges generated at least in the first period. Normally, since the amount of electric charges generated in the first period is less than the amount of electric charges generated in a single exposure time, the saturation charge quantity of the photoelectric conversion portion PD can be reduced.

According to the present exemplary embodiment, in the second period, the control unit 3 controls turning OFF of the first transfer switch TX1 from ON only once (time t15). However, control is not limited thereto. In the second period, the control unit 3 may control turning OFF of the first transfer switch TX1 from ON zero times or a plurality of times. When turning OFF of the first transfer switch TX1 is performed zero times, electric charges generated in the photoelectric conversion portion PD in the second exposure are immediately transferred to the holding portion MEM and held by the holding portion MEM. When turning OFF of the first transfer switch TX1 is performed a plurality of times, electric charge transfer from the photoelectric conversion portion PD to the holding portion MEM is performed at least three times in the exposure period for one frame. If the control unit 3 controls turning OFF of the first transfer switch TX1 from ON a plurality of times in the second period, the saturation charge quantity of the photoelectric conversion portion PD can be further reduced.

It is desirable that the number of times of turning ON the first transfer switch TX1 from OFF in the exposure period corresponding to one frame is almost equal to or larger than the ratio of the saturation charge quantity of the holding portion MEM to the saturation charge quantity of the photoelectric conversion portion PD. It is more desirable that the number of times of turning ON the first transfer switch TX1 is almost equal to the ratio. With this configuration, the sizes of the photoelectric conversion portion PD and the holding portion MEM can be optimized.

Effects of Present Exemplary Embodiment

A configuration and effects of the present exemplary embodiment will be described below with reference to FIGS. 8A to 13E. A description will be given of a case where the imaging apparatus 1 operates in the second drive mode.

When an image is captured using a camera, a subject is illuminated by a certain light source, and the light of the light source is reflected by the subject and is incident to the imaging apparatus 1 through a lens. FIGS. 8A to 13E illustrate an example case where a subject perceived as white by the human eyes is captured under the light source.

First Comparative Example

Before describing the configuration and effects of the present exemplary embodiment, a comparative example will be described below. In the imaging apparatus according to a first comparative example, the saturation charge quantity of the photoelectric conversion portion PD is identical for each of the red (R), green (Gr, Gb), and blue (B) pixels (hereinafter referred to as a "R pixel", "G pixel", and "B pixel", respectively). FIGS. 8A to 10E illustrate operations of the imaging apparatus according to the first comparative example under different incident light conditions.

FIG. 8A is a timing chart illustrating a drive pulse in a similar two-time transfer operation to that illustrated in FIG. 7. FIG. 8B illustrates the light quantity of light incident to a certain region of the imaging apparatus. Referring to FIG. 8B, the lower dashed line indicates the light quantity 0 (no incident light), and the upper dashed line indicates the light quantity with which the photoelectric conversion portion PD of the G pixel just reaches the saturation in each of the first and the second exposure periods. Referring to the example illustrated in FIGS. 8A to 8E, light of an intermediate quantity between the two dashed lines illustrated in FIG. 8B is incident to the region in the imaging plane. The light quantity is constant throughout the first and the second exposure periods illustrated in FIGS. 8A to 8E.

FIGS. 8C, 8D, and 8E illustrate the changes with time of the electric charge quantities in the photoelectric conversion portions PD of the G, R, and B pixels, respectively. For example, the operation of the G pixel will be described below.

At the time t4, when the discharge switch TX3 turns OFF from ON, the accumulation of electric charges in the photoelectric conversion portion PD is started. In the example illustrated in FIGS. 8A to 8E, since the incident light quantity is constant, the electric charge quantity of the photoelectric conversion portion PD increases in proportion to time. At the time t15, the first-time charge transfer from the photoelectric conversion portion PD to the holding portion MEM is completed, and the electric charge quantity of the photoelectric conversion portion PD becomes zero.

In the second exposure period starting from the time t15, the electric charge quantity of the photoelectric conversion portion PD similarly increases in proportion to time. At the time t13, electric charges are transferred again to the holding portion MEM, and the electric charge quantity of the photoelectric conversion portion PD becomes zero again.

If the saturation level of the photoelectric conversion portion PD is 1, in the example illustrated in FIGS. 8A to 8E, an electric charge quantity of 0.7 is accumulated in the G pixel in each of the first and the second exposure periods. These electric charge quantities are added in the holding portion MEM, and the G pixel outputs an electric charge quantity of 0.7+0.7=1.4 for the frame.

In this case, the R and B pixels also perform a similar operation. In the examples illustrated FIGS. 8A to 8E, an electric charge quantity of 0.6+0.6=1.2 is accumulated in the R pixel, and an electric charge quantity of 0.35+0.35=0.7 is accumulated in the B pixel.

In the example illustrated in FIGS. 8A to 8E, the ratio of the light quantities (G:R:B) when a subject perceived as white by the human eyes is captured under the light source is 1.4:1.2:0.7. This ratio depends on the light source with which the subject is irradiated and is referred to as a white balance.

Supplementary information of the white balance will be provided below. The human eyes perceive a white object as white under any light source. To meet this condition of the human eyes, a camera multiplies each of the signals from the G, R, and B pixels by the gain according to the white balance to generate a final developed image. This gain is referred to as a white balance gain. The white balance gain is normally multiplied by an engine (signal processing unit) in the subsequent stage of the imaging apparatus. In this example, for a subject perceived as white by the human eyes under this light source, the engine multiplies the signal from the R pixel by 1.4/1.2=1.17 and multiplies the signal from the B pixel by 1.4/0.7=2 to equalize the luminance values of the G, R, and B pixels in the final developed image. If the white balance is inappropriate, there arises a phenomenon in which a white object is not perceived as white in the final developed image. In this example, this phenomenon is referred to as a coloring problem.

According to the first comparative example, as described above, the photoelectric conversion portions PD of the G, R, and B pixels provide the same saturation charge quantity. According to the first comparative example, the OFF level of the gate drive line PTX3 of the discharge switch TX3 is common to all the pixels. More specifically, all the pixels provide the same height of the potential barrier of the discharge switch TX3 in the OFF state. Even if all the pixels provide the same saturation charge quantity as in the first comparative example, the coloring problem does not arise if none of the photoelectric conversion portions PD of the pixels reach the saturation in the exposure period, as illustrated in FIGS. 8A to 8E.

FIGS. 9A to 9E illustrate the electric charge quantity of each pixel in a case where the incident light quantity is larger than the incident light quantity in the case illustrated in FIGS. 8A to 8E in the imaging apparatus according to the first comparative example. FIGS. 9A to 9E illustrate a case where the incident light quantity to the region is higher than the saturation level of the G pixel, and the light quantity is constant in the one-frame period.

At this timing, the electric charge quantity of the photoelectric conversion portion PD of the G pixel reaches the saturation level 1 in both the first and the second exposure periods. Since the electric charge quantity equal to or larger than the saturation charge quantity cannot be accumulated in the photoelectric conversion portion PD, the G pixel outputs an electric charge quantity of 1+1=2 for the frame.

As illustrated in FIGS. 9D and 9E, when the G pixel reaches the saturation level "1" although neither of the R and B pixels of the region have reached the saturation, the engine in the subsequent stage determines that the output of the region is saturated. In such a region, for example, all of the G, R, and B pixels are determined to have the maximum gradation. Therefore, the region is processed as a white region with the maximum luminance in the final developed image.

Therefore, the coloring problem does not arise even if all the pixels provide the same saturation charge quantity as in the first comparative example also in a case where the photoelectric conversion portion PD of the G pixel reaches the saturation in both the first and the second exposure periods as illustrated in FIGS. 9A to 9E.

FIGS. 10A to 10E illustrate a situation where the coloring problem arises in the imaging apparatus according to the first comparative example. FIGS. 10A to 10E indicates a case where, for example, a subject perceived as white by the human eyes is moving. In this case, the incident light quantity to the region exceeds the G saturation level in the first exposure period, and the incident light becomes darker to provide an intermediate light quantity in the second exposure period.

The electric charge quantity of the photoelectric conversion portion PD of the G pixel reaches the saturation level 1 in the first exposure period, and becomes 0.7 in the second exposure period, whereby a final output is 1+0.7=1.7. On the other hand, the photoelectric conversion portions PD of neither of the R and B pixels reach the saturation in both the first and the second exposure periods.

In this case, since the final output of the G pixel does not reach "1", the engine in the subsequent stage does not determine the saturation. However, since only the photoelectric conversion portion PD of the G pixel reaches the saturation in the first exposure period, the electric charge quantity of the G pixel becomes smaller than the inherent value. Thus, the ratio of the electric charge quantities of the G, R, and B pixels deviates. As a result, the output ratio between the G, R, and B pixels for the frame will be deviated.

Under this light source, the appropriate ratio G:R:B when a white subject is captured is 1.4:1.2:0.7=1:0.86:0.5 as illustrated in FIGS. 8A to 8E. However, in the situation illustrated in FIGS. 10A to 10E, the output ratio G:R:B is 1.7:1.55:0.9=1:0.91:0.53 which is deviated from the appropriate ratio G:R:B. In this case, since the R:B output ratio has relatively increased, the final developed image will be colored in magenta. More specifically, in the imaging apparatus according to the first comparative example, if a bright subject moves, the periphery of the subject may be colored.

A configuration and effects of the present exemplary embodiment will be described below centering on the first exemplary embodiment as an example. In the imaging apparatus according to the first exemplary embodiment, the saturation charge quantity of the photoelectric conversion portion PD is differentiated between the G, R, and B pixels. More specifically, the imaging apparatus includes a first pixel, a second pixel, and a third pixel each having a different saturation charge quantity of the photoelectric conversion portion PD. More specifically, when the saturation charge quantity of the photoelectric conversion portion PD of the G pixel is set to 1, the saturation charge quantity of the photoelectric conversion portion PD of the R pixel is set to 0.86, and the saturation charge quantity of the photoelectric conversion portion PD of the B pixel is set to 0.5. As illustrated in FIG. 2, this configuration is implemented by separately providing the gate drive line PTX3 for each of the G, R, and B pixels by color and differentiating the OFF-level potential of the gate drive line PTX3 between the G, R, and B pixels.

This saturation ratio is equalized to the sensitivity ratio of the G, R, and B pixels when a subject perceived as white by the human eyes is captured under this light source. In other words, the saturation ratio is equalized to the white balance ratio under the light source.

Like the case illustrated in FIGS. 10A to 10E, FIGS. 11A to 11E illustrate the electric charge quantity of each pixel in the imaging apparatus according to the first exemplary embodiment in a case where the light quantity exceeds the G saturation level in the first exposure period and becomes an intermediate light quantity in the second exposure period. As described above, the saturation charge quantity is differentiated between the G, R, and B pixels according to the white balance. Therefore, when the G pixel is saturated in the first exposure period, the R and B pixels also reach respective saturation quantity settings. In the second exposure period, neither of the R and B pixels are saturated. Thus, the final output ratio G:R:B becomes 1.7:1.46:0.85=1:0.86:0.5 which is not deviated from the appropriate output ratio in the case illustrated in FIGS. 8A to 8E. More specifically, the imaging apparatus according to the present first exemplary embodiment can prevent the coloring of the periphery of a bright subject which moved.

Contrary to the case illustrated in FIGS. 11A to 11E, FIGS. 12A to 12E illustrate the electric charge quantity of each pixel in the imaging apparatus according to the first exemplary embodiment in a case where the light quantity is an intermediate light quantity in the first exposure period and exceeds the G saturation level in the second exposure period. More specifically, FIGS. 12A to 12E illustrate an example case where the region in the imaging plane changes from a darkish state to a bright state. Also, in this case, coloring can be prevented by suitably differentiating the saturation charge quantity of the photoelectric conversion portion PD between the G, R, and B pixels as in the first exemplary embodiment.

FIGS. 13A to 13E illustrate a case where a subject perceived as white by the human eyes is captured by the imaging apparatus according to the first exemplary embodiment under a different light source from the light source in the cases illustrated in FIGS. 8A to 12E. Also, in this case, like the cases illustrated in FIGS. 11A to 12E, the ratio of the saturation charge quantity of the photoelectric conversion portion PD of each pixel is equalized to the white balance ratio under the light source of the imaging environment. In the case illustrated in FIGS. 13A to 13E, under this light source, the light quantity ratio G:R:B when a subject perceived as white by the human eyes is captured, i.e., the white balance ratio is 1:0.5:0.5. Therefore, in the example illustrated in FIGS. 13A to 13E, when the saturation charge quantity of the photoelectric conversion portion PD of the G pixel is set to 1, the saturation charge quantity of the photoelectric conversion portion PD of the R pixel is set to 0.5, and the saturation charge quantity of the photoelectric conversion portion PD of the B pixel is set to 0.5. Also, in this case, this configuration is implemented by suitably adjusting the OFF-level potential of the gate drive line PTX3 for each of the G, R, and B pixels.

FIGS. 13A to 13E illustrate the electric charge quantity of each pixel in the imaging apparatus according to the first exemplary embodiment in a case where the light quantity exceeds the G saturation level in the first exposure period and becomes an intermediate light quantity in the second exposure period. Also, in this case, like the case illustrated in FIGS. 11A to 11E, when the G pixel is saturated in the first exposure period, the R and B pixels also reach respective saturation quantity settings. In the second exposure period, neither of the R and B pixels are saturated. Thus, the final output ratio G:R:B becomes 1.6:0.8:0.8=1:0.5:0.5 which is not deviated from the appropriate output ratio. More specifically, the imaging apparatus of the present first exemplary embodiment can prevent the coloring of the periphery of a bright subject which moved.

Since the saturation charge quantity of the photoelectric conversion portion PD between pixels is differentiated in this way, the deviation of the pixel output ratio can be prevented in a case where the global electronic shutter operation for electric charge transfer from the photoelectric conversion portion PD to the holding portion MEM is performed during the exposure period for acquiring one frame. More specifically, the deviation of the pixel output ratio can be prevented by differentiating the saturation charge quantity of the photoelectric conversion portion PD between pixels according to color information (or type information) of the color filter of each pixel and the white balance under the light source during imaging.

The imaging apparatus according to the present exemplary embodiment includes a plurality of pixels PIX. The plurality of pixels PIX includes a first pixel and a second pixel each having a different saturation charge quantity of the photoelectric conversion portion PD. In this case, it is desirable that the first and the second pixels have different processing conditions by the signal processing unit in the subsequent stage. It is also desirable that the signal processing includes processing for multiplying the signal output from each pixel PIX by the gain and that the first and the second pixels are assigned different gains. The gain is typically the white balance gain. This configuration enables preventing the deviation of the pixel output ratio. It can also be said that the first and the second pixels are different in sensitivity.

As described above, the saturation charge quantity of the photoelectric conversion portion PD of each pixel can be controlled by the height of the potential barrier of the discharge switch TX3 of each pixel in the OFF state. In a case where the discharge switch TX3 of each pixel is a transistor, the height of the potential barrier of the discharge switch TX3 in the OFF state can be controlled by the OFF voltage to be applied to the gate electrode of the discharge switch TX3, i.e., the OFF-level potential of the gate drive line PTX3. Alternatively, in a case where the discharge switch TX3 of each pixel is a transistor, the height of the potential barrier of the discharge switch TX3 in the OFF state can be controlled by the impurity concentration in a semiconductor region disposed under the gate electrode of the discharge switch TX3.

It is desirable that the saturation charge quantity of the photoelectric conversion portion PD of each pixel can be changed. More specifically, it is desirable that at least either one of the saturation charge quantity of the photoelectric conversion portion PD of the first pixel and the saturation charge quantity of the photoelectric conversion portion PD of the second pixel can be changed. This makes it possible to change the saturation charge quantity of the photoelectric conversion portion PD of each pixel according to imaging conditions and processing conditions in the signal processing unit, whereby the deviation of the pixel output ratio can be prevented under various conditions. In a case where the imaging apparatus includes a condition setting unit for setting processing conditions in the signal processing unit, it is desirable to change the saturation charge quantity of the photoelectric conversion portion PD of each pixel according to a setting by the condition setting unit. Typically, it is desirable to change the saturation charge quantity of the photoelectric conversion portion PD of each pixel according to a white balance setting by the condition setting unit. In this way, coloring can be prevented under different light sources.

Although, in the examples illustrated in FIGS. 11A to 13E, the white balance ratio is equalized to the ratio of the saturation charge quantity of the photoelectric conversion portion PD of the G, R, and B pixels, the configuration is effective even if complete matching is not made. When a white subject is captured, if the saturation charge quantity of the photoelectric conversion portion PD of a pixel with high sensitivity is set larger than the saturation charge quantity of the photoelectric conversion portion PD of a pixel with low sensitivity, an effect of reducing coloring is provided. More specifically, if the first pixel has a larger white balance gain in signal processing in the subsequent stage than the second pixel, the saturation charge quantity of the photoelectric conversion portion PD of the first pixel needs to be set smaller than the saturation charge quantity of the photoelectric conversion portion PD of the second pixel. Then, if the pixel sensitivity ratio (white balance ratio) is brought close to the ratio of the saturation charge quantity of the photoelectric conversion portion PD of each pixel, an effect of reducing coloring increases. To avoid extremely unnatural coloring, it is desirable to restrict the deviation between the pixel sensitivity ratio and the ratio of the saturation charge quantity of the photoelectric conversion portion of each pixel to ±30% or less. More specifically, it is desirable to satisfy the following formula (1).

$$0.7R \leq r \leq 1.3R \qquad (1)$$

Referring to formula (1), R is the ratio of the gain to be applied for multiplication to the signal of the second pixel to the gain to be applied for multiplication to the signal of the first pixel in signal processing by the signal processing unit. Referring to formula (1), r is the ratio of the saturation charge quantity of the photoelectric conversion portion PD of the second pixel to the saturation charge quantity of the photoelectric conversion portion PD of the first pixel.

Although FIGS. 10A to 13E illustrate cases where the incident light quantity to the region changes near the boundary between the first and the second exposure periods, the effects of the present exemplary embodiment are not limited to the cases. Even in a case where the incident light quantity changes during the first or the second exposure period and a case where the light quantity changes not in step form but in slope form, similar effects are provided.

Although the imaging apparatus of the present exemplary embodiment operates at least in the second drive mode, the drive mode may be switchable and the imaging apparatus may be operable also in the first drive mode. In the first drive mode (one-time transfer operation), when the photoelectric conversion portion PD of the G pixel is saturated, the engine in the subsequent stage can determine the saturation and therefore the coloring problem does not arise. Therefore, in the first drive mode, the saturation charge quantity of the photoelectric conversion portion PD may be identical for each pixel. Since the imaging apparatus according to the first exemplary embodiment is configured to separately set the OFF-level potential of the gate drive line PTX3 of each pixel, the imaging apparatus can separately set the saturation charge quantity of the photoelectric conversion portion PD of each pixel. Thus, in response to the drive mode switching, the control unit 3 may change the saturation charge quantity of the photoelectric conversion portion PD of each pixel. More specifically, when the first drive mode is selected, the control unit 3 may change the OFF-level potential of the gate drive line PTX3 of each pixel to be identical for each pixel. If the timing of the control signal of the first transfer switch TX1 of each pixel is made variable and the OFF-level potential of the gate drive line PTX3 is changed based on the number of times of transfer or transfer timing, these changes are supported within an imaging apparatus.

A second exemplary embodiment will be described below. Only differences from the first exemplary embodiment will be described in detail below. Like the first exemplary embodiment, an overall block diagram of the imaging apparatus according to the second exemplary embodiment is illustrated in FIG. 1.

Figure 14:
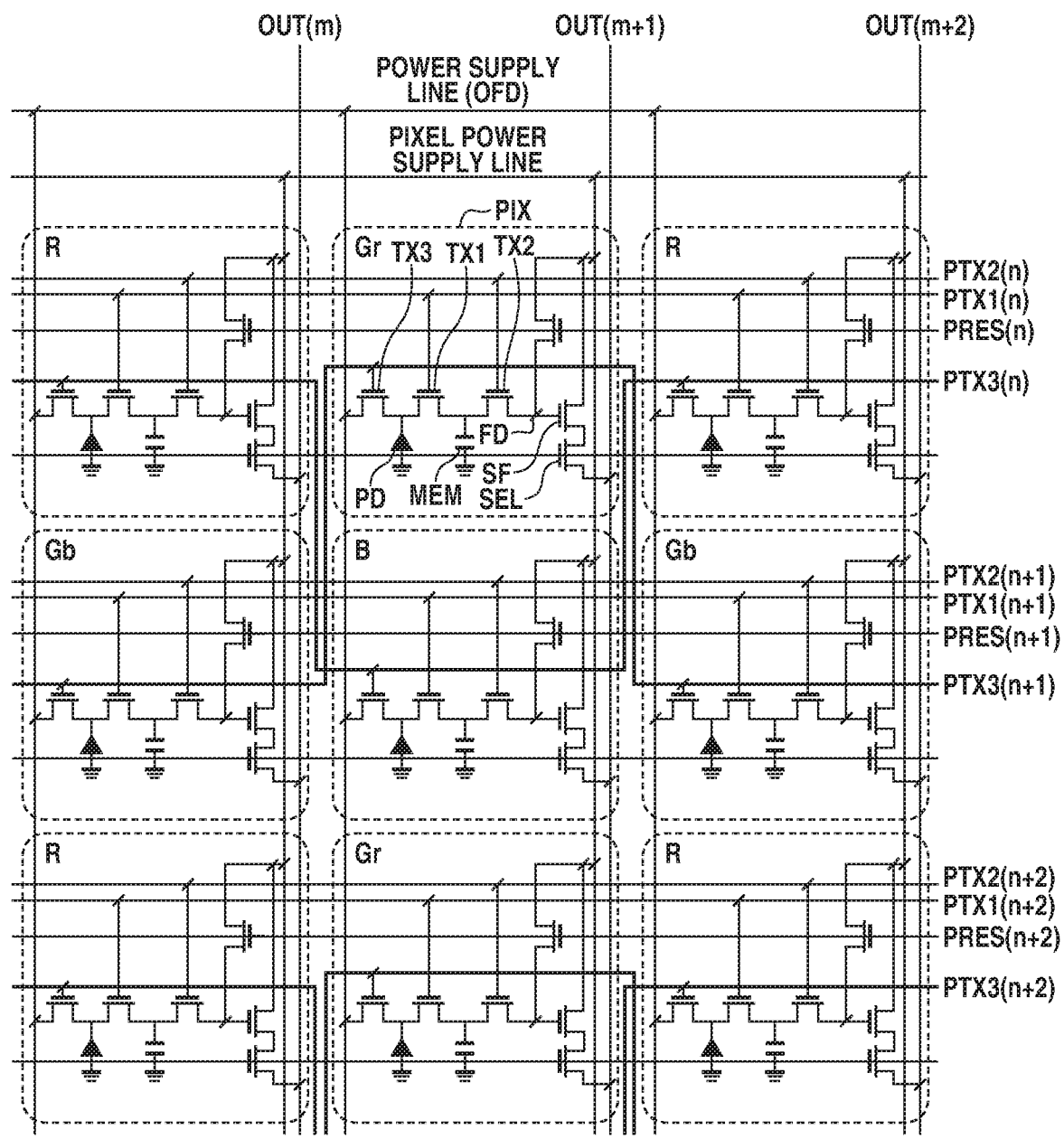
FIG. 14 is a diagram illustrating an equivalent circuit of the imaging apparatus.

The imaging apparatus according to the second exemplary embodiment will be described below centering on the second exemplary embodiment as an example. FIG. 14 illustrates an equivalent circuit of the pixels included in the imaging region 2 in the imaging apparatus according to the second exemplary embodiment. As drawn by the thick lines illustrated in FIG. 14, in the imaging apparatus according to the second exemplary embodiment, the discharge switches TX3 of the R and B pixels are driven by the same line, and the discharge switch TX3 of the G pixel (Gr, Gb) is driven by the same line. In the imaging apparatus according to the second exemplary embodiment, as illustrated in FIG. 14, the drive line of the discharge switch TX3 of each pixel PIX meanders according to the type of the color filter CF. The gate drive line PTX(n) and the gate drive line PTX(n+2) are identical in a region (not illustrated).

For example, in the example case under the light source according to the first exemplary embodiment illustrated in FIGS. 13A to 13E, the sensitivity (or the white balance gain) when a subject perceived as white by the human eyes is captured is identical for each of the R and B pixels. Thus, coloring can be prevented if the saturation charge quantity of the photoelectric conversion portion PD of the G pixel and the saturation charge quantities of the photoelectric conversion portions PD of the R and B pixels can be separately adjusted. In other words, in this case, coloring can be prevented even if the saturation charge quantity of the photoelectric conversion portion PD of the R pixel and the saturation charge quantity of the photoelectric conversion portion PD of the B pixel cannot be separately adjusted.

Like the circuit illustrated in FIG. 14, the imaging apparatus according to the second exemplary embodiment separates the line for the driving the discharge switch TX3 of the G pixel and the line for driving the discharge switches TX3 of the R and B pixels. This configuration enables separately adjusting the OFF-level potential of the discharge switch TX3 between the G, R, and B pixels. According to the second exemplary embodiment, since the discharge switch TX3 of the R pixel and the discharge switch TX3 of the B pixel are driven by the same line, the saturation charge quantities of the R and B pixels cannot be separately adjusted. However, coloring can be prevented depending on the light source, for example, under the light source illustrated in FIGS. 13A to 13E.

Figure 15:
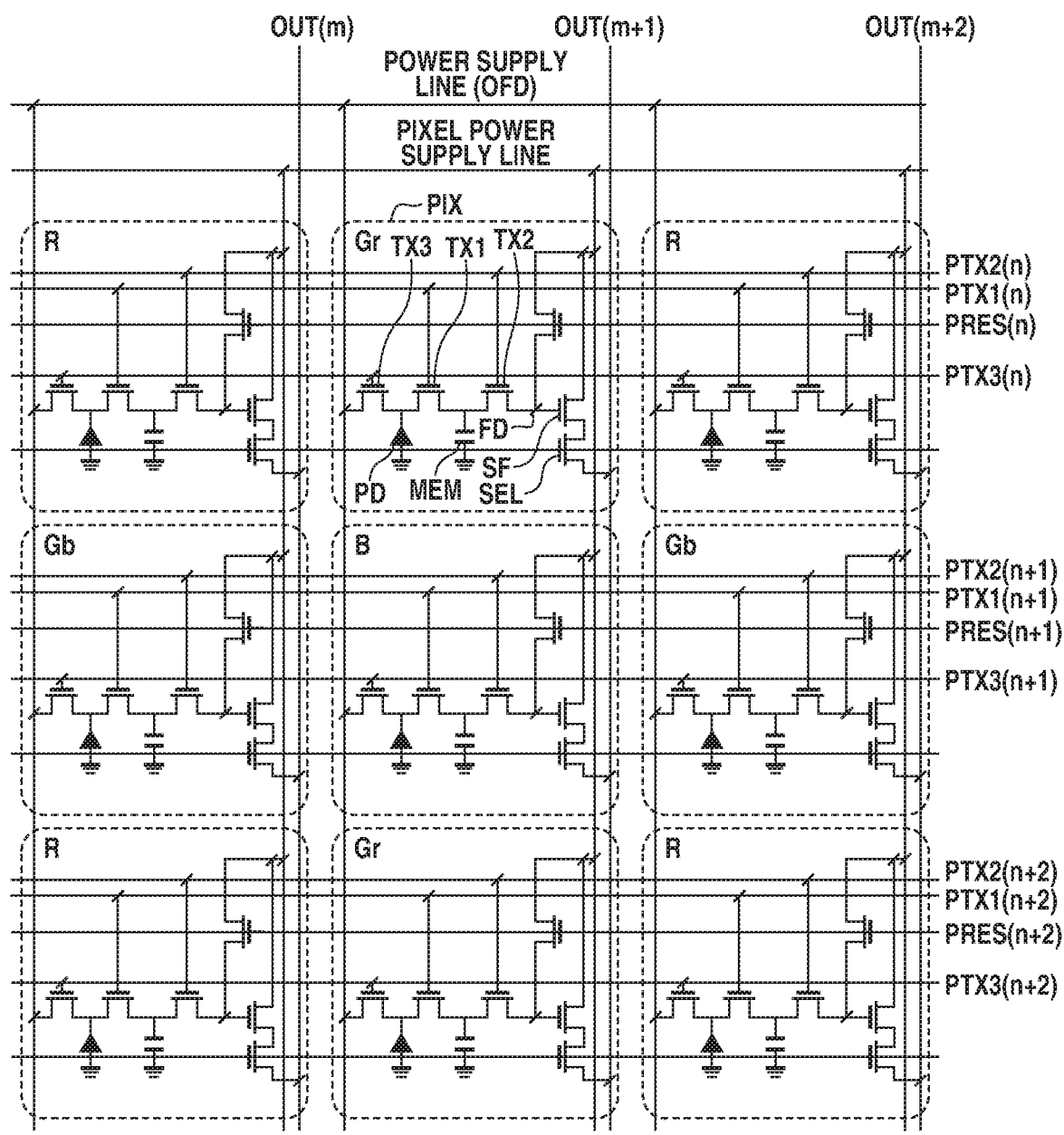
FIG. 15 is a diagram illustrating an equivalent circuit of the imaging apparatus.

A third exemplary embodiment will be described below as another example of the imaging apparatus according to the second exemplary embodiment. FIG. 15 illustrates an equivalent circuit of the pixels included in the imaging region 2 in the imaging apparatus according to the third exemplary embodiment. As illustrated in FIG. 15, in the imaging apparatus according to the third exemplary embodiment, the discharge switches TX3 of all of the G, R, and B pixels are driven by the same line. The gate drive lines PTX(n), PTX(n+1), and PTX(n+2) are identical in a region (not illustrated).

According to the third exemplary embodiment, the saturation charge quantity of the photoelectric conversion portion PD is differentiated between pixels by differentiating, between pixels, the impurity concentration of the semiconductor region disposed under the gate electrode of the discharge switch TX3.

Figure 16:
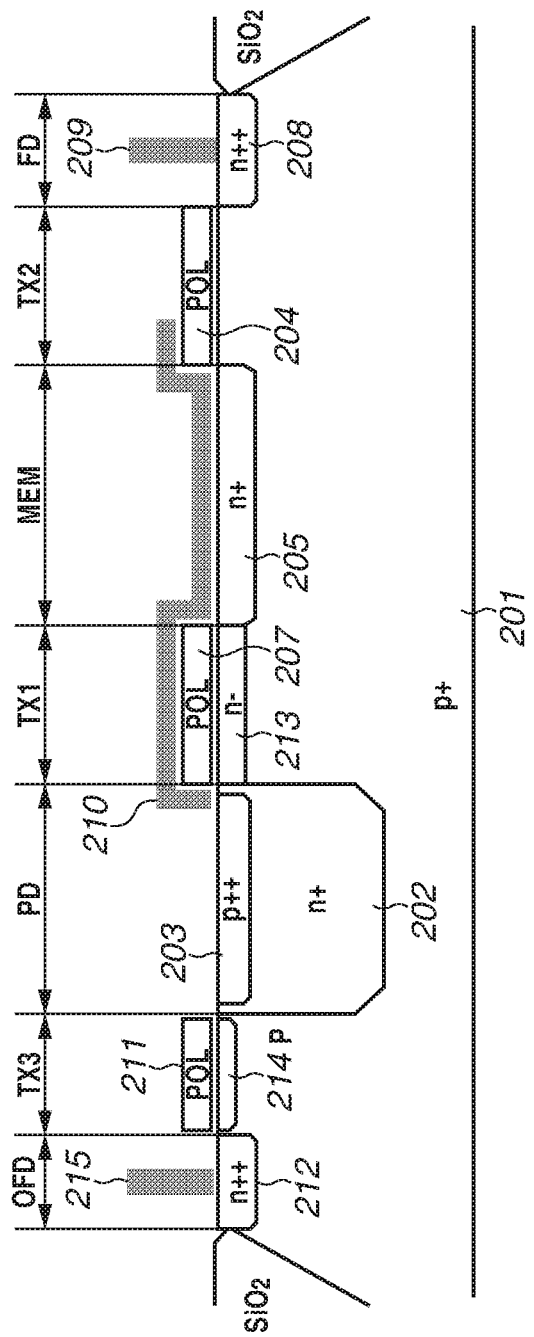
FIG. 16 is a schematic diagram illustrating a cross-sectional structure of the imaging apparatus.

FIG. 16 is a schematic diagram illustrating a cross-sectional structure of the imaging apparatus according to the third exemplary embodiment. More specifically, FIG. 16 illustrates a cross-section of one pixel. The cross-sectional structure of the imaging apparatus according to the present exemplary embodiment differs from the cross-sectional structure of the imaging apparatus according to the first exemplary embodiment illustrated in FIG. 3 in that a p-type region 214 as an individual semiconductor region for each pixel is provided under the gate electrode 211 of the discharge switch TX3 via an insulating layer (not illustrated). In the imaging apparatus according to the third exemplary embodiment, the height of the potential barrier of the discharge switch TX3 in the OFF state is differentiated by differentiating the impurity concentration of the p-type region 214 between the G, R, and B pixels. This configuration differentiates the saturation charge quantity of the photoelectric conversion portion PD between the G, R, and B pixels to equalize the ratio of the saturation charge quantity of each pixel to the white balance ratio. With this arrangement, coloring is prevented.

A third exemplary embodiment will be described below. Only differences from the first exemplary embodiment will be described in detail below. Like the first exemplary embodiment, an overall block diagram of the imaging apparatus according to the third exemplary embodiment is illustrated in FIG. 1.

Figure 17:
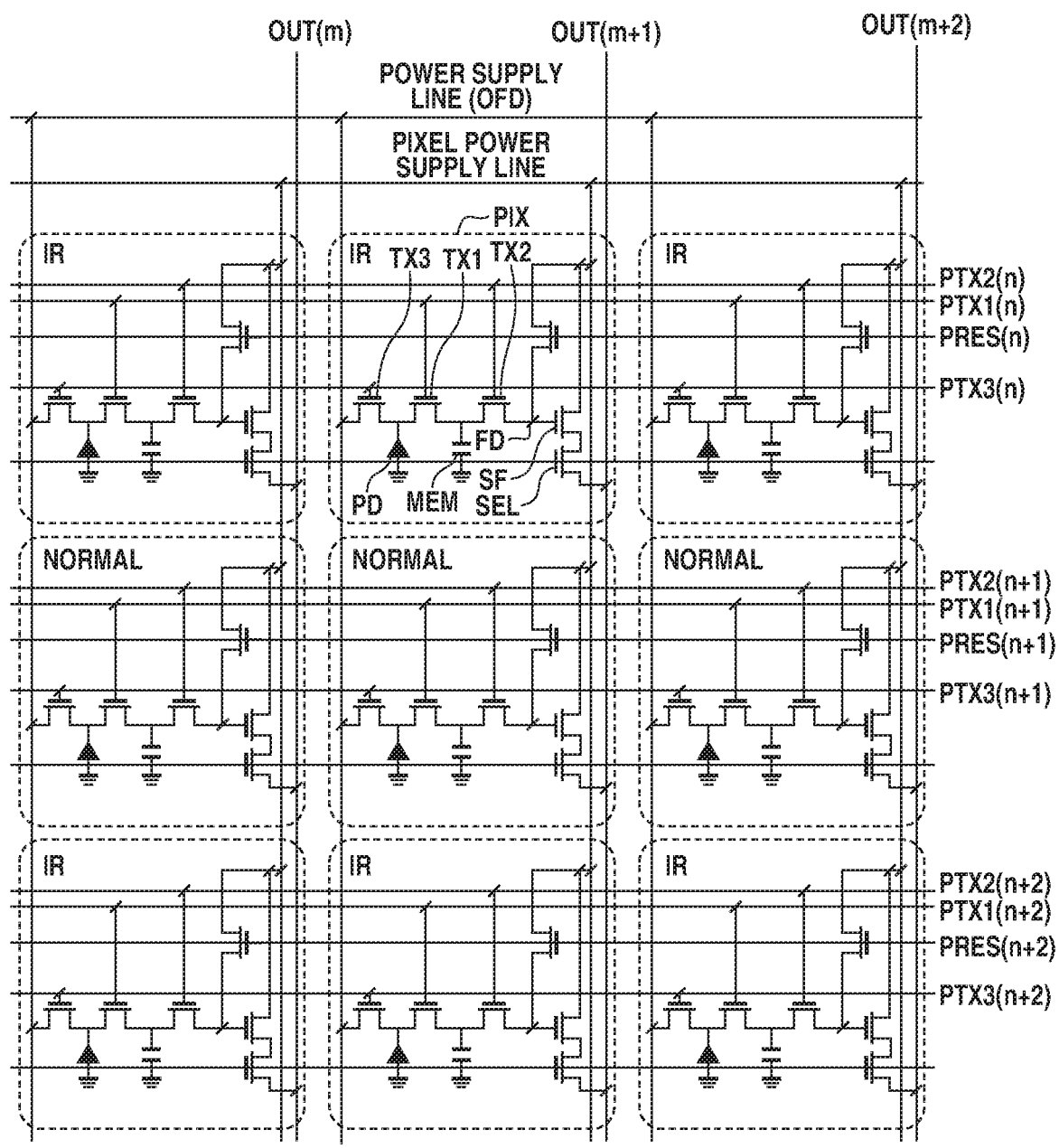
FIG. 17 is a diagram illustrating an equivalent circuit of the imaging apparatus.

FIG. 17 illustrates an equivalent circuit of the pixels included in the imaging region 2 in the imaging apparatus according to the third exemplary embodiment. The imaging apparatus according to the third exemplary embodiment includes normal pixels and infrared (IR) pixels. An IR pixel refers to a pixel having a larger depth of the photoelectric conversion portion PD in a semiconductor substrate than a normal pixel to provide high sensitivity to infrared light. The imaging apparatus according to the third exemplary embodiment does not have color filters. Each normal pixel of the imaging apparatus according to the third exemplary embodiment has a similar structure to each pixel according to the first and the second exemplary embodiments except that a color filter is not provided.

As illustrated in FIG. 17, in the imaging apparatus according to the third exemplary embodiment, IR pixels are arranged in the nth row, normal pixels are arranged in the (n+1)th row, and IR pixels are arranged in the (n+2)th row. An output containing only the infrared light component can be obtained from the imaging apparatus according to the third exemplary embodiment by subtracting the output from a normal pixel from the output from an IR pixel in adjacent rows (for example, the nth and (n+1)th rows).

Figure 18:
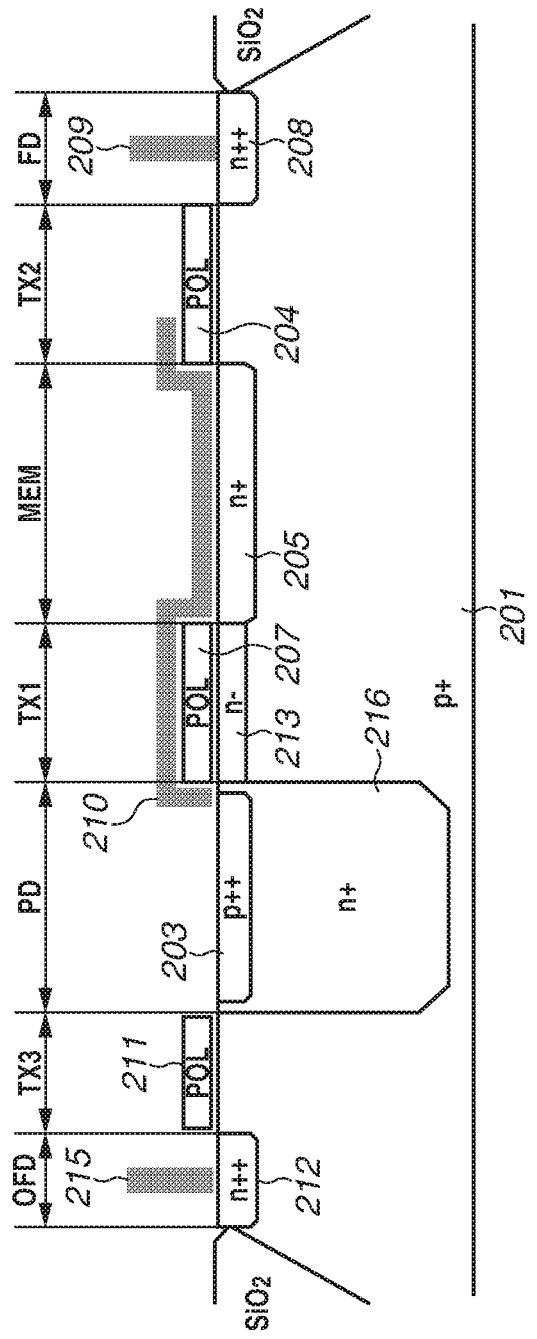
FIG. 18 is a schematic diagram illustrating a cross-sectional structure of the imaging apparatus.

FIG. 18 is a schematic diagram illustrating a cross-sectional structure of the imaging apparatus according to the third exemplary embodiment. More specifically, FIG. 18 illustrates a cross-section of one IR pixel. In the cross-sectional structure of a normal pixel, the color filter CF has been removed from the structure illustrated in FIG. 3. Instead of the N-type semiconductor region 202 included in a normal pixel, an IR pixel includes an N-type semiconductor region 216 having a large depth in a semiconductor substrate.

Second Comparative Example

Figure 20A:
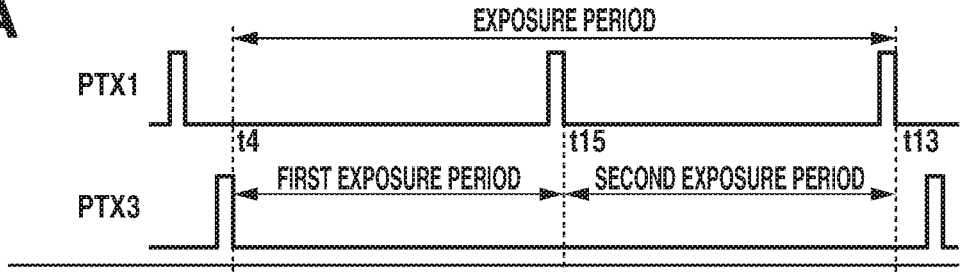
FIGS. 20A to 20D are schematic diagrams illustrating drive pulses of the imaging apparatus and examples of electric charge quantities in pixel portions in the second drive mode.
Figure 20B:
Figure 20C:
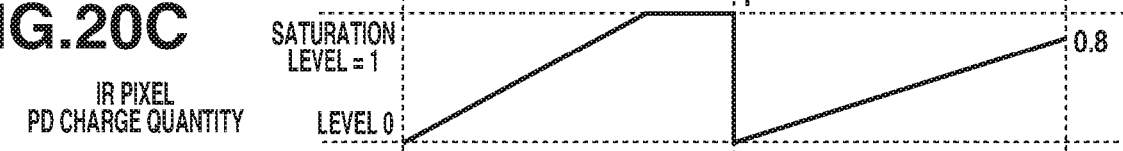
Figure 20D:
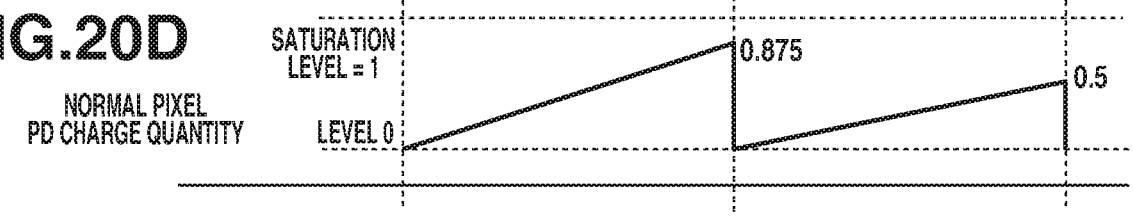

Prior to the description of a configuration and effects of the present exemplary embodiment, another comparative example will be described below. In the imaging apparatus according to the second comparative example, a normal pixel and an IR pixel have the same saturation charge quantity of the photoelectric conversion portion PD. FIGS. 19A to 20D illustrate operations of the imaging apparatus according to the second comparative example under different incident light conditions. FIGS. 19A to 21D are similar to FIGS. 8A to 13E. FIGS. 19A, 20A, and 21A are timing charts illustrating drive pulses. FIGS. 19B, 20B, and 21B illustrate the light quantity of light incident to a certain region of the imaging apparatus. FIGS. 19C, 20C, and 21C illustrate the changes with time of the electric charge quantity of the photoelectric conversion portion PD of an IR pixel. FIGS. 19D, 20D, and 21D illustrate the changes with time of the electric charge quantity of the photoelectric conversion portion PD of a normal pixel.

In the situation illustrated in FIGS. 19A to 19D, the photoelectric conversion portion PD of neither of the normal and the IR pixels is saturated in both the first and the second exposure periods. Therefore, the ratio of the outputs from the IR and normal pixels for the frame is the same as the sensitivity ratio of both pixels. The output from the IR pixel is 0.8+0.8=1.6, the output from the normal pixel is 0.5+ 0.5=1, and the output ratio (IR pixel to normal pixel) is 1.6:1.

FIGS. 20A to 20D are diagrams illustrating an example case where the incident light quantity changes in the first and the second exposure periods according to the second comparative example. In the situation illustrated in FIGS. 20A to 20D, the IR pixel is saturated in the first exposure period and is not saturated in the second exposure period. On the other hand, the normal pixel is not saturated in the first and the second exposure periods. Therefore, the final pixel output ratio will deviate from the pixel sensitivity ratio. Since the output of the IR pixel is 1+0.8=1.8 and the output of the normal pixel is 0.875+0.5=1.375, the final pixel output ratio (IR pixel to normal pixel) becomes 1.8:1.375=1.309:1 which is deviated from the sensitivity ratio 1.6:1. If the IR pixel output minus the normal pixel output is calculated, there is obtained an inaccurate image which contains less infrared light component than that in a case where the IR pixel is not saturated in each exposure period as illustrated in FIGS. 19A to 19D. More specifically, a deviation of the pixel output ratio occurs even in this case.

In an imaging apparatus according to a fourth exemplary embodiment as an example of the third exemplary embodiment, the saturation charge quantity of the photoelectric conversion portion PD is differentiated between the IR and the normal pixels. More specifically, the imaging apparatus includes a first pixel and a second pixel each having a different saturation charge quantity of the photoelectric conversion portion PD. More specifically, when the saturation charge quantity of the photoelectric conversion portion PD of the IR pixel is set to 1, the saturation charge quantity of the photoelectric conversion portion PD of the normal pixel is set to 0.625. As illustrated in FIG. 17, this configuration is implemented by separately providing the line of the gate drive line PTX3 for the IR and the normal pixels and differentiating the OFF-level potential of the gate drive line PTX3 between the IR and the normal pixels.

Like the case illustrated in FIGS. 20A to 20D, FIGS. 21A to 21D illustrate the electric charge quantity of each pixel in the imaging apparatus according to the fourth exemplary embodiment in a case where the light quantity exceeds the IR saturation level in the first exposure period and becomes an intermediate light quantity in the second exposure period. As described above, the saturation charge quantity is differentiated between the IR and the normal pixels based on the sensitivity ratio. Therefore, when the IR pixel is saturated in the first exposure period, the normal pixel also reaches the set saturation quantity. In the second exposure period, neither of the IR and normal pixels are saturated. As a result, the final output ratio (IR pixel to normal pixel) becomes 1.8: 1.125=1.6:1 which is not deviated from the appropriate output ratio in the case illustrated in FIGS. 19A to 19D.

As described above, in the imaging apparatus according to the third exemplary embodiment, the saturation charge quantity of the photoelectric conversion portion PD is differentiated between pixels. This configuration enables preventing the deviation of the pixel output ratio in a case where the global electronic shutter operation for electric charge transfer from the photoelectric conversion portion PD to the holding portion MEM is performed during the exposure period for acquiring one frame.

Figure 22:
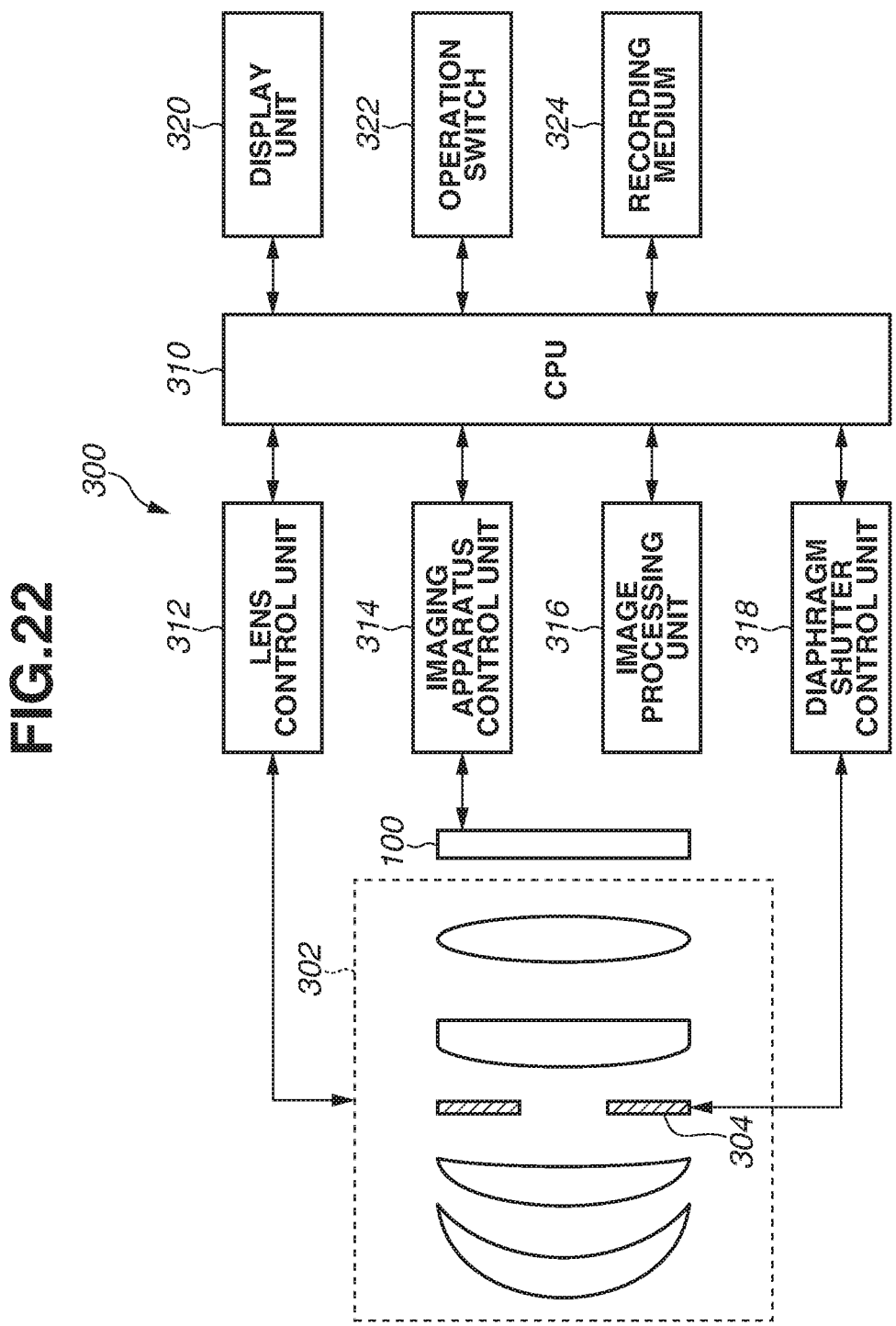
FIG. 22 is a block diagram illustrating a configuration of an imaging system.

The imaging system according to the fourth exemplary embodiment will be described below with reference to FIG. 22. FIG. 22 is a block diagram illustrating an overall configuration of the imaging system according to the present exemplary embodiment.

The imaging apparatuses according to the first to the third exemplary embodiments are applicable to diverse imaging systems. Examples of such imaging systems are not particularly limited and include digital still cameras, digital camcorders, monitoring cameras, copying machines, facsimiles, mobile phones, on-vehicle cameras, and observation satellites. A camera module including an optical system (such as lenses) and an imaging apparatus is also included in an imaging system. FIG. 22 is a block diagram of a digital still camera as an example of an imaging system.

As illustrated in FIG. 22, an imaging system 300 includes an imaging apparatus 100, an imaging optical system 302, a central processing unit (CPU) 310, a lens control unit 312, an imaging apparatus control unit 314, an image processing unit 316, a diaphragm shutter control unit 318, a display unit 320, an operation switch 322, and a recording medium 324.

The imaging optical system 302 forms an optical image of a subject and includes a lens group and a diaphragm 304. The diaphragm 304 is provided with a function of adjusting the light quantity at the time of image capturing by adjusting the aperture diameter, and a function of an exposure time adjustment shutter used at the time of still image capturing. The lens group and the diaphragm 304 is held in such a manner that the lens group and the diaphragm 304 can retract along the optical axis direction, so that a zooming function and a focus adjustment function can be implemented by a collaborative operation of the lens group and the diaphragm 304. The imaging optical system 302 may be integrated with the imaging system 300 and may be an imaging lens attachable to the imaging system 300.

The imaging apparatus 100 is disposed in such a manner that the imaging plane thereof is located in the image space of the imaging optical system 302. The imaging apparatus 100 is any one of the imaging apparatuses according to the first to the third exemplary embodiments and includes a CMOS sensor (a pixel region 10) and a peripheral circuit (peripheral circuit region). In the imaging apparatus 100, a plurality of pixels each having a photoelectric conversion portion is two-dimensionally arranged, and a color filter is disposed in each of these pixels to configure a two-dimensional single-plate color sensor. The imaging apparatus 100 performs the photoelectric conversion on a subject image formed by the imaging optical system 302 and outputs an image signal and a focus detection signal.

The lens control unit 312 controls forward/backward drive of the lens group of the imaging optical system 302 to perform a zooming operation and focus adjustment. The lens control unit 312 includes circuits and processing units for implementing these functions. The diaphragm shutter control unit 318 adjusts the imaging light quantity by changing the aperture diameter of the diaphragm 304 (with a variable diaphragm value). The diaphragm shutter control unit 318 includes circuits and processing units for implementing these functions.

The CPU 310, a control unit for managing various control of the camera main body, includes a calculation unit, a read only memory (ROM), a random access memory (RAM), an analog-to-digital (A/D) converter, a digital-to-analog (D/A) converter, and a communication interface circuit. The CPU 310 controls operations of each section in the camera according to a computer program held in the ROM to perform a series of imaging operations including auto focus (AF) including detection of the focus state of the imaging optical system 302 (focus detection), image capturing, image processing, and recording. The CPU 310 also serves as a signal processing unit.

The imaging apparatus control unit 314 controls operations of the imaging apparatus 100, performs the A/D conversion on the signal output from the imaging apparatus 100 and transmits the resultant signal to the CPU 310. The imaging apparatus control unit 314 includes circuits and control units configured to implement these functions. The imaging apparatus 100 may be provided with the A/D conversion function. The image processing unit 316 performs image processing such as gamma conversion and color interpolation on the signal having undergone the A/D conversion to generate an image signal. The image processing unit 316 includes circuits and control units configured to implement these functions. As described above, the imaging system 300 includes a processing apparatus including the CPU 310 and the image processing unit 316. The processing apparatus performs various correction and data compression processing on the imaging data output from the imaging apparatus 100.

The display unit 320 is a display apparatus such as a liquid crystal display (LCD) for displaying information about the imaging mode of the camera, a preview image before image capturing, an image for checking after image capturing, and the in-focus state at the time of focus detection. The operation switch 322 includes a power switch, a release (imaging trigger) switch, a zoom operation switch, and an imaging mode selection switch. The recording medium 324 records a captured image, and may be a medium built in the imaging system 300 or a medium such as a memory card that can be attached and detached to and from the imaging system 300.

With the above described configuration, the imaging system 300 to which any one of the imaging apparatus 100 according to the first to the third exemplary embodiments is applied becomes possible to implement a high-performance imaging system capable of performing high-precision focus adjustment and acquiring an image with a large depth of field.

Figure 23A:
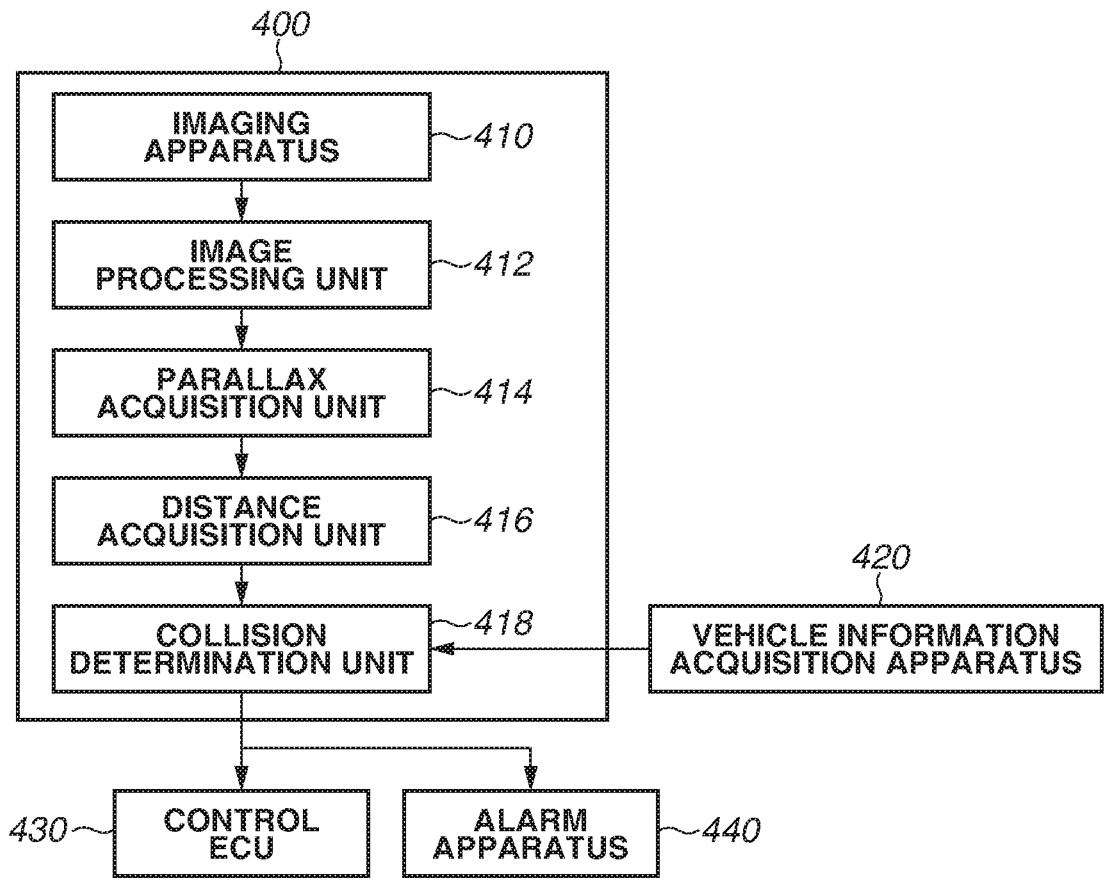
FIGS. 23A and 23B are block diagrams illustrating configurations of a mobile object.
Figure 23B:
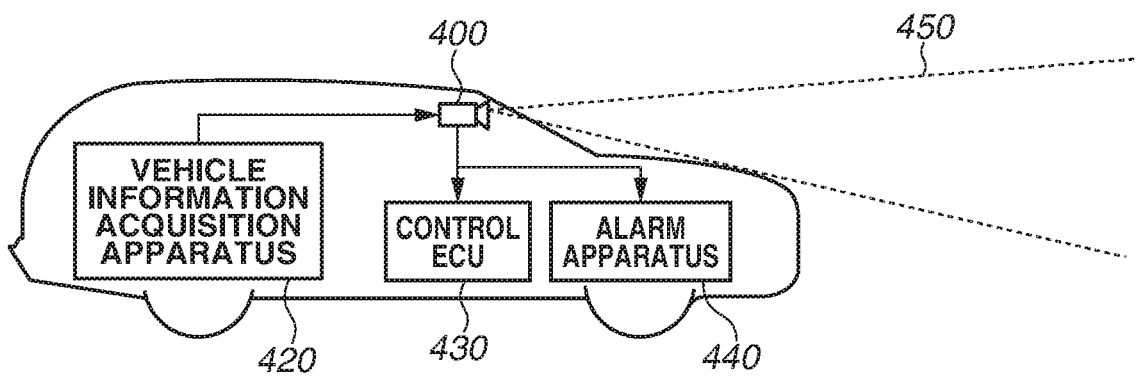

An imaging system and a mobile object according to a fifth exemplary embodiment will be described below with reference to FIGS. 23A and 23B. FIGS. 23A and 23B are diagrams illustrating configurations of the imaging system and the mobile object according to the present exemplary embodiment.

FIG. 23A illustrates an example of an imaging system 400 related to an on-vehicle camera. The imaging system 400 includes an imaging apparatus 410 which is any one of the above-described imaging apparatuses according to the first to the third exemplary embodiments. The imaging system 400 includes an image processing unit 412 for performing image processing on a plurality of pieces of image data acquired by the imaging apparatus 410, and a parallax acquisition unit 414 for calculating the parallax (parallax image phase difference) based on the plurality of pieces of image data acquired by the imaging apparatus 410. The imaging system 400 also includes a distance acquisition unit 416 for calculating the distance to a subject based on the calculated parallax, and a collision determination unit 418 for determining the possibility of collision based on the calculated distance. The parallax acquisition unit 414 and the distance acquisition unit 416 are examples of a distance information acquisition unit for acquiring information about the distance to a subject. More specifically, the information about the distance is information about the parallax, defocusing amount, and the distance to a subject. The collision determination unit 418 may determine the possibility of collision by using these pieces of the distance information. The distance information acquisition unit may also be implemented by a specially designed hardware component or a software module. The distance information acquisition unit may also be implemented by a Field Programmable Gate Array (FPGA), an Application Specific Integrated Circuit (ASIC), or a combination of both.

The imaging system 400, connected with the vehicle information acquisition apparatus 420, acquires vehicle information including the vehicle speed, yaw rate, and steering angle. The imaging system 400 is also connected with a control ECU 430 as a control apparatus for outputting control signals for generating a braking force to a vehicle based on the determination result by the collision determination unit 418. More specifically, the control ECU 430 is an example of a mobile object control unit for controlling a mobile object based on the distance information. The imaging system 400 is also connected with an alarm apparatus 440 for generating an alarm to a driver based on the determination result by the collision determination unit 418. For example, when the possibility of collision is determined to be high by the collision determination unit 418, the control ECU 430 performs vehicle control for avoiding a collision and reducing damages by applying brakes, returning the accelerator, and restricting the engine power. The alarm apparatus 440 warns a user by generating an alarm such as sound, displaying alarm information on the screen of a car navigation system, or vibrating the seat belt and steering.

According to the present exemplary embodiment, the imaging system 400 captures an image of the periphery of the vehicle, such as the vehicle front or back. FIG. 23B illustrates the imaging system 400 for capturing an image of the vehicle front (an imaging range 450). The vehicle information acquisition apparatus 420 activates the imaging system 400 and transmits an instruction thereto to perform image capturing. By using any one of the above-described imaging apparatuses according to the first to the third exemplary embodiments as the imaging apparatus 410, the imaging system 400 according to the present exemplary embodiment can further improve the accuracy of distance measurement.

Although the present exemplary embodiment has been described above centering on an example of control for avoiding a collision with other vehicles, the present exemplary embodiment is also applicable to automatic driving control for following another vehicle and automatic driving control for retaining the vehicle within a lane. The imaging system 400 is applicable not only to vehicles such as automobiles but also to other mobile objects (moving apparatuses) such as vessels, airplanes, and industrial robots. In addition, the imaging system 400 is applicable not only to mobile objects but also to intelligent transport systems (ITS) and a wide range of apparatuses utilizing object recognition.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-085872, filed Apr. 26, 2018, which is hereby incorporated by reference herein in its entirety.

What is claimed is:

1. An imaging apparatus comprising:
a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, and a second transfer switch configured to transfer the electric charges from the holding portion to the amplification portion;
output lines connected to the plurality of pixels; and
a signal processing unit configured to perform signal processing on the signals output from the plurality of pixels based on any one of a plurality of processing conditions,
wherein, in the signal processing, a processing condition applied to the signal output from the first pixel and a processing condition applied to the signal output from the second pixel are different from each other,
wherein,
at a first time, the photoelectric conversion portions of the plurality of pixels start accumulating the electric charges,
from the first time to a second time, the first transfer switch of at least one of the plurality of pixels is kept OFF, and the photoelectric conversion portion of the at least one of the plurality of pixels accumulates electric charges generated in a first period that starts at the first time and ends at the second time,
the first transfer switches of the plurality of pixels are controlled to turn ON from OFF by the second time at the latest,
at a third time following the second time, the holding portions of the plurality of pixels hold both electric charges generated in the photoelectric conversion portion in the first period and electric charges generated in the photoelectric conversion portion in a second period that starts at the second time and ends at the third time, and
the plurality of pixels includes a first pixel and a second pixel, and
a saturation charge quantity of the photoelectric conversion portion of the first pixel is different from a saturation charge quantity of the photoelectric conversion portion of the second pixel.

2. The imaging apparatus according to claim 1, wherein
the imaging apparatus captures images for a first frame and a second frame following the first frame,
an exposure period corresponding to the second frame includes the first period and the second period,
at the first time, the holding portion holds electric charges corresponding to the first frame, and
in the first period, the second transfer switches of the plurality of pixels turn ON in turns and the amplification portions of the plurality of pixels output the signals in turns in such a manner that outputs of the signals to be used in the image for the first frame are completed by the second time at the latest.

3. The imaging apparatus according to claim 1, wherein
the signal processing includes processing for multiplying the signal by a gain, and
in the signal processing, a first gain to be applied in amplifying the signal output from the first pixel and a second gain to be applied in amplifying the signal output from the second pixel are different from each other.

4. The imaging apparatus according to claim 3, wherein the first gain and the second gain are set in accordance with a white balance.

5. The imaging apparatus according to claim 3, wherein in the signal processing, the first gain is smaller than the second gain, and the saturation charge quantity of the photoelectric conversion portion of the first pixel is larger than the saturation charge quantity of the photoelectric conversion portion of the second pixel.

6. The imaging apparatus according to claim 3, wherein, in the signal processing, the following formula is satisfied:

$$0.7R<r<1.3R,$$

where r is a ratio of the second gain to the first gain, and R is a ratio of the saturation charge quantity of the photoelectric conversion portion of the second pixel to the saturation charge quantity of the photoelectric conversion portion of the first pixel.

7. The imaging apparatus according to claim 1, wherein at least either one of the saturation charge quantity of the photoelectric conversion portion of the first pixel and the saturation charge quantity of the photoelectric conversion portion of the second pixel is configured to be variable.

8. The imaging apparatus according to claim 1, further comprising
a condition setting unit configured to set the processing conditions in the signal processing unit,
wherein, according to a setting of the processing conditions by the condition setting unit, the imaging apparatus varies at least either one of the saturation charge quantity of the photoelectric conversion portion of the first pixel and the saturation charge quantity of the photoelectric conversion portion of the second pixel.

9. An imaging apparatus comprising:
a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, and a second transfer switch configured to transfer the electric charges from the holding portion to the amplification portion; and
output lines connected to the plurality of pixels, wherein,
at a first time, the photoelectric conversion portions of the plurality of pixels start accumulating the electric charges,
from the first time to a second time, the first transfer switch of at least one of the plurality of pixels is kept OFF, and the photoelectric conversion portion of the at least one of the plurality of pixels accumulates electric charges generated in a first period that starts at the first time and ends at the second time,
the first transfer switches of the plurality of pixels are controlled to turn ON from OFF by the second time at the latest,
at a third time following the second time, the holding portions of the plurality of pixels hold both electric charges generated in the photoelectric conversion portion in the first period and electric charges generated in the photoelectric conversion portion in a second period that starts at the second time and ends at the third time, and
the plurality of pixels includes a first pixel and a second pixel, and
a saturation charge quantity of the photoelectric conversion portion of the first pixel is different from a saturation charge quantity of the photoelectric conversion portion of the second pixel, and wherein
each of the plurality of pixels further includes a discharge switch configured to discharge the electric charges accumulated in the photoelectric conversion portion, and
a height of a potential barrier provided by a discharge switch of the first pixel in an OFF state is different from a height of a potential barrier provided by a discharge switch of the second pixel in an OFF state.

10. The imaging apparatus according to claim 9, wherein at least either one of the height of the potential barrier provided by the discharge switch of the first pixel in an OFF state and the height of the potential barrier provided by the discharge switch of the second pixel in an OFF state is configured to be variable.

11. The imaging apparatus according to claim 9, wherein
the discharge switch is a transistor, and
the height of the potential barrier provided by the discharge switch in an OFF state varies in accordance with a voltage to be applied to a gate of the discharge switch for setting the discharge switch in the OFF state.

12. The imaging apparatus according to claim 9, wherein
the discharge switch is a transistor, and
an OFF voltage to be applied to a gate of the discharge switch of the first pixel is different from an OFF voltage to be applied to a gate of the discharge switch of the second pixel.

13. The imaging apparatus according to claim 9, wherein
the discharge switch is a transistor, and
an impurity concentration of a semiconductor region that is disposed under a gate electrode of the discharge switch of the first pixel is different from an impurity concentration of a semiconductor region that is disposed under a gate electrode of the discharge switch of the second pixel.

14. The imaging apparatus according to claim 1, wherein
each of the first and the second pixels includes a color filter that is disposed on the photoelectric conversion portion, and
a color of the color filter of the first pixel is different from a color of the color filter of the second pixel.

15. The imaging apparatus according to claim 14, wherein
the color filter included in the first pixel is a green color filter,
the color filter included in the second pixel is a red color filter or a blue color filter, and
a saturation charge quantity of the photoelectric conversion portion of the first pixel is larger than a saturation charge quantity of the photoelectric conversion portion of the second pixel.

16. The imaging apparatus according to claim 1, wherein
each of the plurality of pixels includes a color filter that is disposed on the photoelectric conversion portion and a discharge switch for discharging the electric charges accumulated in the photoelectric conversion portion,
the plurality of pixels are arranged in a matrix form such that the first pixel and the second pixel are arranged in a same row/column, a color of the color filter of the first pixel is different from a color of the color filter of the second pixel, and at least two lines are provided in the same row/column, one connected to the discharge switch of the first pixel and another one connected to the discharge switch of the second pixel.

17. An imaging apparatus comprising:

a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, and a second transfer switch configured to transfer the electric charges from the holding portion to the amplification portion; and output lines connected to the plurality of pixels, wherein, at a first time, the photoelectric conversion portions of the plurality of pixels start accumulating the electric charges, from the first time to a second time, the first transfer switch of at least one of the plurality of pixels is kept OFF, and the photoelectric conversion portion of the at least one of the plurality of pixels accumulates electric charges generated in a first period that starts at the first time and ends at the second time, the first transfer switches of the plurality of pixels are controlled to turn ON from OFF by the second time at the latest, at a third time following the second time, the holding portions of the plurality of pixels hold both electric charges generated in the photoelectric conversion portion in the first period and electric charges generated in the photoelectric conversion portion in a second period that starts at the second time and ends at the third time, and the plurality of pixels includes a first pixel and a second pixel, and a saturation charge quantity of the photoelectric conversion portion of the first pixel is different from a saturation charge quantity of the photoelectric conversion portion of the second pixel, and wherein each of the plurality of pixels includes a color filter that is disposed on an upstream side of the photoelectric conversion portion in an incident direction of the incident light, and a discharge switch for discharging the electric charges accumulated in the photoelectric conversion portion, pixels having different types of the color filters are arranged in a matrix form, and based on the type of the color filter, wiring of a gate of the discharge switch for each of the plurality of pixels is arranged in a winding manner.

18. An imaging apparatus comprising:

a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, and a second transfer switch configured to transfer the electric charges from the holding portion to the amplification portion;

output lines connected to the plurality of pixels; and a setting unit configured to set a white balance, and wherein, according to a setting of the white balance, the imaging apparatus varies at least either one of the saturation charge quantity of the photoelectric conversion portion included in the first pixel and the saturation charge quantity of the photoelectric conversion portion included in the second pixel, and wherein, at a first time, the photoelectric conversion portions of the plurality of pixels start accumulating the electric charges, from the first time to a second time, the first transfer switch of at least one of the plurality of pixels is kept OFF, and the photoelectric conversion portion of the at least one of the plurality of pixels accumulates electric charges generated in a first period that starts at the first time and ends at the second time, the first transfer switches of the plurality of pixels are controlled to turn ON from OFF by the second time at the latest, at a third time following the second time, the holding portions of the plurality of pixels hold both electric charges generated in the photoelectric conversion portion in the first period and electric charges generated in the photoelectric conversion portion in a second period that starts at the second time and ends at the third time, and the plurality of pixels includes a first pixel and a second pixel, and a saturation charge quantity of the photoelectric conversion portion of the first pixel is different from a saturation charge quantity of the photoelectric conversion portion of the second pixel.

19. An imaging apparatus comprising:

a plurality of pixels each including a photoelectric conversion portion configured to accumulate electric charges generated by incident light, a holding portion configured to hold the electric charges, an amplification portion configured to output a signal based on the electric charges, a first transfer switch configured to transfer the electric charges from the photoelectric conversion portion to the holding portion, a second transfer switch configured to transfer the electric charges from the holding portion to the amplification portion, and a discharge switch configured to discharge the electric charges accumulated in the photoelectric conversion portion; and output lines connected to the plurality of pixels, at a first time, the photoelectric conversion portions of the plurality of pixels start accumulating the electric charges, from the first time to a second time, the first transfer switch of at least one of the plurality of pixels is kept OFF, and the photoelectric conversion portion of the at least one of the plurality of pixels accumulates electric charges generated in a first period that starts at the first time and ends at the second time, the first transfer switches of the plurality of pixels are controlled to turn ON from OFF by the second time at the latest, at a third time following the second time, the holding portions of the plurality of pixels hold both electric charges generated in the photoelectric conversion portion in the first period and electric charges generated in the photoelectric conversion portion in a second period that starts at the second time and ends at the third time, the discharge switch is a transistor, and an OFF voltage to be applied to a gate of the discharge switch of the first pixel for setting the discharge switch thereof in an OFF state is different from a voltage to be applied to a gate of the discharge switch of a second pixel for setting the discharge switch thereof in an OFF state.

20. The imaging apparatus according to claim 19, wherein each of the first and the second pixels includes a color filter that is disposed on the photoelectric conversion portion, and a color of the color filter of the first pixel is different from a color of the color filter of the second pixel.

21. An imaging system comprising:

the imaging apparatus according to claim 1; and a processing apparatus configured to processes a signal output from the imaging apparatus.

22. A mobile object comprising:

the imaging apparatus according to claim 1;

a distance information acquisition unit configured to acquire information about a distance to a subject based on a signal output from the plurality of pixels of the imaging apparatus; and a control unit configured to control the mobile object based on the distance information.

* * * * *